(12) United States Patent
Lin et al.

(10) Patent No.: US 10,686,107 B2
(45) Date of Patent: Jun. 16, 2020

(54) LIGHT EMITTER DEVICES AND COMPONENTS WITH IMPROVED CHEMICAL RESISTANCE AND RELATED METHODS

(71) Applicant: CREE, Inc., Durham, NC (US)

(72) Inventors: Shaow B. D. Lin, Cary, NC (US); Peter Scott Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/691,102

(22) Filed: Nov. 30, 2012

(65) Prior Publication Data
US 2013/0161658 A1   Jun. 27, 2013

Related U.S. Application Data

(63) Continuation-in-part of application No. 13/309,177, filed on Dec. 1, 2011, now Pat. No. 10,211,380, and
(Continued)

(51) Int. Cl.
*H01L 33/52* (2010.01)
*H01L 33/60* (2010.01)
*H01L 33/44* (2010.01)

(52) U.S. Cl.
CPC ............. *H01L 33/60* (2013.01); *H01L 33/44* (2013.01); *H01L 2224/48091* (2013.01);
(Continued)

(58) Field of Classification Search
CPC ... H01L 33/501; H01L 66/502; H01L 33/504; H01L 33/52; H01L 33/56; H01L 33/44; G03B 21/008; G02B 26/0833
See application file for complete search history.

(56) References Cited

U.S. PATENT DOCUMENTS

| 3,288,728 A | 11/1966 | Gorham |
| 3,609,475 A | 9/1971 | Kaposhilin |

(Continued)

FOREIGN PATENT DOCUMENTS

| CN | 101 047 220 | 10/2007 |
| CN | 101276870 A | 10/2008 |

(Continued)

OTHER PUBLICATIONS

"SCS Parylene Coatings for LEDS," Specialty Coating Systems, 2009, pp. 1-2, Indianapolis, IN, USA.
(Continued)

*Primary Examiner* — Benjamin P Sandvik
(74) *Attorney, Agent, or Firm* — Jenkins, Wilson, Taylor & Hunt, P.A.

(57) ABSTRACT

Light emitter devices, components and methods are disclosed. In one aspect, a light emitter component of a light emitter device is disclosed. The light emitter component can include a silver (Ag) portion at least partially disposed over a surface of the component. The component can further include a protective layer at least partially disposed over the Ag portion, the protective layer at least partially including an organic barrier material that increases or improves chemical resistance of the Ag portion. In some aspects, the protective layer includes a polyxylylene (e.g., poly(p-xylylene), a substituted poly(p-xylylene), a fluorocarbon containing poly (p-xylylene), and/or any other polymer prepared from a xylylene and/or comprising $-CH_2-(C_6H_4)-CH_2-$ based repeating units. In some aspects, the protective layer includes Parylene.

16 Claims, 7 Drawing Sheets

Related U.S. Application Data a continuation-in-part of application No. 13/554,769, filed on Jul. 20, 2012, now Pat. No. 10,490,712.

(60) Provisional application No. 61/510,310, filed on Jul. 21, 2011, provisional application No. 61/576,764, filed on Dec. 16, 2011.

(52) U.S. Cl.
CPC .............. *H01L 2224/48137* (2013.01); *H01L 2224/48247* (2013.01); *H01L 2224/8592* (2013.01); *H01L 2924/181* (2013.01); *H01L 2933/0058* (2013.01); *Y10T 428/24612* (2015.01); *Y10T 428/263* (2015.01); *Y10T 428/265* (2015.01); *Y10T 428/3154* (2015.04); *Y10T 428/31678* (2015.04); *Y10T 428/31692* (2015.04)

(56) References Cited

U.S. PATENT DOCUMENTS

| | | |
|---|---|---|
| 3,875,456 A | 4/1975 | Kano et al. |
| H445 H | 3/1988 | Bock et al. |
| 4,918,497 A | 4/1990 | Edmond |
| 4,946,547 A | 8/1990 | Palmour |
| 4,966,862 A | 10/1990 | Edmond |
| 5,027,168 A | 6/1991 | Edmond |
| 5,200,022 A | 4/1993 | Kong |
| 5,210,051 A | 5/1993 | Carter, Jr. |
| 5,338,944 A | 8/1994 | Edmond |
| 5,359,345 A | 10/1994 | Hunter |
| RE34,861 E | 2/1995 | Davis |
| 5,393,993 A | 2/1995 | Edmond |
| 5,416,342 A | 5/1995 | Edmond |
| 5,523,589 A | 6/1996 | Edmond |
| 5,604,135 A | 2/1997 | Edmond |
| 5,631,190 A | 5/1997 | Negley |
| 5,739,554 A | 4/1998 | Edmond |
| 5,912,477 A | 6/1999 | Negley |
| 5,959,316 A | 9/1999 | Lowery |
| 6,120,600 A | 9/2000 | Edmond |
| 6,121,637 A | 9/2000 | Isokawa et al. |
| 6,187,606 B1 | 2/2001 | Edmond |
| 6,201,262 B1 | 3/2001 | Edmond |
| 6,252,254 B1 | 6/2001 | Soules et al. |
| 6,350,041 B1 | 2/2002 | Tarsa et al. |
| 6,514,782 B1 | 2/2003 | Wierer, Jr. et al. |
| 6,576,930 B2 | 6/2003 | Reeh et al. |
| 6,600,175 B1 | 7/2003 | Baretz |
| 6,717,353 B1 | 4/2004 | Mueller et al. |
| 6,791,119 B2 | 9/2004 | Slater, Jr. |
| 6,853,010 B2 | 2/2005 | Slater, Jr. |
| 6,860,621 B2 | 3/2005 | Bachl et al. |
| 6,936,857 B2 | 8/2005 | Doxsee et al. |
| 6,958,497 B2 | 10/2005 | Emerson |
| 7,005,679 B2 | 2/2006 | Tarsa et al. |
| 7,026,661 B2 | 4/2006 | Murano |
| 7,087,936 B2 | 8/2006 | Negley |
| 7,095,056 B2 | 8/2006 | Vitta |
| 7,183,677 B2 | 2/2007 | Mueller-Mach |
| 7,211,835 B2 | 5/2007 | Ono |
| 7,213,940 B1 | 5/2007 | Van De Van |
| 7,244,965 B2 | 7/2007 | Andrews et al. |
| 7,246,930 B2 | 7/2007 | Yatsuda et al. |
| 7,250,715 B2 | 7/2007 | Mueller et al. |
| 7,304,326 B2 | 12/2007 | Suehiro et al. |
| 7,344,902 B2 | 3/2008 | Basin et al. |
| 7,456,499 B2 | 11/2008 | Loh |
| 7,476,909 B2 | 1/2009 | Nagai et al. |
| 7,534,635 B1 | 5/2009 | Foust et al. |
| 7,564,180 B2 | 7/2009 | Brandes |
| 7,598,669 B2 | 10/2009 | Toguchi et al. |
| 7,638,811 B2 | 12/2009 | Slater |
| 7,655,957 B2 | 2/2010 | Loh |
| 7,709,853 B2 | 5/2010 | Medendorp |
| 7,791,061 B2 | 9/2010 | Edmond et al. |
| 7,821,023 B2 | 10/2010 | Yuan et al. |
| 7,825,575 B2 | 11/2010 | Sawanobori et al. |
| 7,833,073 B2 | 11/2010 | Ogawa |
| 7,842,526 B2 | 11/2010 | Hadame et al. |
| 7,868,343 B2 | 1/2011 | Negley |
| 7,948,076 B2 | 5/2011 | Wang |
| 7,952,115 B2 | 5/2011 | Loh |
| 8,011,818 B2 | 9/2011 | Negley |
| 8,052,307 B2 | 11/2011 | Bak et al. |
| 8,058,088 B2 | 11/2011 | Cannon |
| 8,319,240 B2 | 11/2012 | Nakayama |
| 8,378,379 B2 | 2/2013 | Tanida et al. |
| 8,398,892 B2 | 3/2013 | Shioi |
| 8,723,200 B2 | 5/2014 | Cho et al. |
| 8,858,022 B2 | 10/2014 | Jiang et al. |
| 8,946,747 B2 | 2/2015 | Reiherzer |
| 8,957,580 B2 | 2/2015 | Reiherzer |
| 9,055,700 B2 | 6/2015 | Humphries et al. |
| 9,240,530 B2 | 1/2016 | Reiherzer |
| 9,343,441 B2 | 5/2016 | Reiherzer |
| 9,496,466 B2 | 11/2016 | Hussell et al. |
| 10,008,637 B2 | 6/2018 | Britt et al. |
| 10,211,380 B2 | 2/2019 | Lin et al. |
| 10,490,712 B2 | 11/2019 | Lin et al. |
| 2002/0004577 A1 | 1/2002 | Biebuyck et al. |
| 2002/0163006 A1 | 11/2002 | Yoganandan et al. |
| 2003/0067761 A1 | 4/2003 | Horiuchi et al. |
| 2004/0069993 A1 | 4/2004 | Murano |
| 2004/0079957 A1 | 4/2004 | Andrews et al. |
| 2004/0252501 A1 | 12/2004 | Moriyama |
| 2005/0007783 A1 | 1/2005 | Ono |
| 2005/0045898 A1 | 3/2005 | Leu et al. |
| 2005/0093430 A1 | 5/2005 | Ibbetson et al. |
| 2005/0159581 A1* | 7/2005 | Vanderzande .......... C08F 28/02 528/391 |
| 2005/0194609 A1* | 9/2005 | Furukawa ............. H01L 33/501 257/100 |
| 2005/0224830 A1 | 10/2005 | Blonder et al. |
| 2006/0091415 A1 | 5/2006 | Yan |
| 2006/0091788 A1 | 5/2006 | Yan |
| 2006/0099449 A1* | 5/2006 | Amano .................. C09K 11/06 428/690 |
| 2006/0105484 A1* | 5/2006 | Basin .................... B29C 39/006 438/27 |
| 2006/0113906 A1 | 6/2006 | Ogawa |
| 2006/0124953 A1 | 6/2006 | Negley et al. |
| 2006/0138621 A1 | 6/2006 | Bogner |
| 2006/0145172 A1 | 7/2006 | Se et al. |
| 2006/0163589 A1 | 7/2006 | Fan et al. |
| 2006/0181866 A1 | 8/2006 | Jung et al. |
| 2006/0186418 A1 | 8/2006 | Edmond |
| 2006/0221272 A1 | 10/2006 | Negley |
| 2006/0226759 A1 | 10/2006 | Masuda et al. |
| 2007/0012940 A1 | 1/2007 | Suh et al. |
| 2007/0090383 A1 | 4/2007 | Ota et al. |
| 2007/0158668 A1 | 7/2007 | Tarsa |
| 2007/0170447 A1 | 7/2007 | Negley |
| 2007/0139923 A1 | 8/2007 | Negley |
| 2007/0182323 A1* | 8/2007 | Ogata .................... H01L 33/56 313/512 |
| 2007/0223219 A1 | 9/2007 | Medendorp et al. |
| 2007/0228387 A1 | 10/2007 | Negley et al. |
| 2007/0253209 A1 | 11/2007 | Loh |
| 2007/0268694 A1 | 11/2007 | Bailey et al. |
| 2008/0012036 A1 | 1/2008 | Loh |
| 2008/0037252 A1* | 2/2008 | Nii ........................ H01L 33/60 362/267 |
| 2008/0080165 A1 | 4/2008 | Kim et al. |
| 2008/0121921 A1 | 5/2008 | Loh |
| 2008/0169758 A1* | 7/2008 | Cok ..................... H01L 51/5262 313/506 |
| 2008/0173884 A1 | 7/2008 | Chitnis |
| 2008/0179617 A1* | 7/2008 | Kadotani .............. H01L 33/56 257/98 |
| 2008/0179811 A1 | 7/2008 | Chitnis |
| 2008/0198112 A1 | 8/2008 | Roberts |

(56) References Cited

U.S. PATENT DOCUMENTS

| | | | |
|---|---|---|---|
| 2008/0237616 A1 | 10/2008 | Hatakoshi et al. | |
| 2008/0239724 A1 | 10/2008 | Moriyama et al. | |
| 2008/0258130 A1 | 10/2008 | Bergmann | |
| 2008/0081065 A1 | 11/2008 | Bulavin | |
| 2008/0303052 A1* | 12/2008 | Lee | H01L 33/52 257/99 |
| 2008/0308825 A1 | 12/2008 | Chakraborty | |
| 2009/0010017 A1* | 1/2009 | Hayashi | H01L 33/44 362/516 |
| 2009/0039375 A1 | 2/2009 | LeToquin | |
| 2009/0050907 A1 | 2/2009 | Yuan | |
| 2009/0050908 A1 | 2/2009 | Yuan | |
| 2009/0050924 A1 | 2/2009 | Edmond | |
| 2009/0065792 A1 | 3/2009 | Thompson et al. | |
| 2009/0080185 A1 | 3/2009 | McMillan | |
| 2009/0108281 A1 | 4/2009 | Keller et al. | |
| 2009/0179213 A1 | 7/2009 | Cannon | |
| 2009/0184616 A1 | 7/2009 | Van De Ven | |
| 2009/0194782 A1 | 8/2009 | Hata et al. | |
| 2009/0212316 A1 | 8/2009 | Braune et al. | |
| 2009/0231833 A1 | 9/2009 | Miki et al. | |
| 2009/0236621 A1 | 9/2009 | Chakraborty | |
| 2009/0236759 A1 | 9/2009 | Kashiwagi | |
| 2009/0250714 A1 | 10/2009 | Yun et al. | |
| 2009/0261374 A1 | 10/2009 | Hayashi | |
| 2009/0283779 A1 | 11/2009 | Negley et al. | |
| 2009/0295265 A1 | 12/2009 | Tabuchi et al. | |
| 2009/0309116 A1 | 12/2009 | Kato et al. | |
| 2009/0315057 A1 | 12/2009 | Konishi et al. | |
| 2010/0025699 A1 | 2/2010 | Liu | |
| 2010/0025709 A1 | 2/2010 | Koseki et al. | |
| 2010/0090244 A1* | 4/2010 | Ohba | H01L 33/08 257/98 |
| 2010/0102344 A1* | 4/2010 | Ueji | H01L 33/507 257/98 |
| 2010/0103660 A1 | 4/2010 | Van de Ven et al. | |
| 2010/0133556 A1 | 6/2010 | Li et al. | |
| 2010/0155763 A1 | 6/2010 | Donofrio | |
| 2010/0200874 A1 | 8/2010 | Shioi et al. | |
| 2010/0203657 A1 | 8/2010 | Kim | |
| 2010/0208487 A1 | 8/2010 | Li | |
| 2010/0213502 A1* | 8/2010 | Kashiwagi | C08G 77/20 257/100 |
| 2010/0226130 A1 | 9/2010 | Cheng et al. | |
| 2010/0237375 A1 | 9/2010 | Yamazaki et al. | |
| 2010/0252851 A1 | 10/2010 | Emerson et al. | |
| 2010/0258830 A1 | 10/2010 | Ide et al. | |
| 2010/0283381 A1 | 11/2010 | Takahashi et al. | |
| 2010/0289395 A1 | 11/2010 | Sun et al. | |
| 2011/0001148 A1 | 1/2011 | Sun et al. | |
| 2011/0031513 A1* | 2/2011 | Hsieh | H01L 33/44 257/88 |
| 2011/0046319 A1 | 2/2011 | Ueno et al. | |
| 2011/0108875 A1 | 5/2011 | Takenaka et al. | |
| 2011/0204398 A1* | 8/2011 | Tanida et al. | 257/98 |
| 2011/0220920 A1 | 9/2011 | Collins | |
| 2011/0220929 A1 | 9/2011 | Collins et al. | |
| 2011/0220939 A1* | 9/2011 | Nakayama | 257/98 |
| 2011/0241049 A1 | 10/2011 | Tanida et al. | |
| 2011/0242806 A1 | 10/2011 | Ramer et al. | |
| 2011/0248289 A1 | 10/2011 | Hsieh et al. | |
| 2011/0253429 A1* | 10/2011 | Humphries et al. | 174/255 |
| 2011/0272721 A1 | 11/2011 | Butterworth | |
| 2011/0278618 A1* | 11/2011 | Nakayama | H01L 33/44 257/98 |
| 2011/0284897 A1* | 11/2011 | Takayama | H01L 33/486 257/98 |
| 2012/0007119 A1* | 1/2012 | Shiobara | H01L 33/44 257/98 |
| 2012/0126257 A1 | 5/2012 | Reiherzer et al. | |
| 2012/0161621 A1 | 6/2012 | Sato | |
| 2012/0193649 A1 | 8/2012 | Donofrio | |
| 2012/0193660 A1 | 8/2012 | Donofrio | |
| 2013/0020590 A1 | 1/2013 | Lin | |
| 2013/0141905 A1 | 6/2013 | Hussell | |
| 2013/0141920 A1 | 6/2013 | Emerson | |
| 2013/0168719 A1 | 7/2013 | Watkins et al. | |
| 2013/0207130 A1 | 8/2013 | Reiherzer | |
| 2013/0207141 A1 | 8/2013 | Reiherzer | |
| 2013/0207142 A1 | 8/2013 | Reiherzer | |
| 2013/0208442 A1 | 8/2013 | Reiherzer | |
| 2013/0214298 A1 | 8/2013 | Lin | |
| 2019/0165228 A1 | 5/2019 | Lin et al. | |

FOREIGN PATENT DOCUMENTS

| | | |
|---|---|---|
| CN | 101438424 A | 5/2009 |
| CN | 101514806 A | 8/2009 |
| CN | 101 814 571 A | 8/2010 |
| CN | 102150480 | 8/2011 |
| CN | 102163680 | 8/2011 |
| CN | 201918428 | 8/2011 |
| CN | 102192423 A | 9/2011 |
| CN | 102214775 | 10/2011 |
| CN | 102214776 A | 10/2011 |
| CN | 103782402 | 5/2014 |
| CN | 104247055 | 12/2014 |
| CN | 104247060 | 12/2014 |
| CN | 103988324 B | 3/2017 |
| CN | 103782402 B | 12/2017 |
| CN | 104115293 B | 7/2018 |
| EP | 1536487 | 6/2005 |
| EP | 2056363 A2 | 5/2009 |
| EP | 2365549 A1 | 9/2011 |
| EP | 2226553 A3 | 1/2014 |
| EP | 2786429 | 10/2014 |
| EP | 2791982 | 10/2014 |
| EP | 2791984 | 10/2014 |
| JP | S58 67077 A | 4/1983 |
| JP | 2001-291406 | 10/2001 |
| JP | 2003-243704 A | 8/2003 |
| JP | 2005-244226 | 9/2005 |
| JP | 2006-054209 A | 2/2006 |
| JP | 2006-245443 | 9/2006 |
| JP | 2007-266343 A | 10/2007 |
| JP | 2008-010591 A | 1/2008 |
| JP | 2009-033107 A | 2/2009 |
| JP | 2009-076948 A | 4/2009 |
| JP | 2009-111395 | 5/2009 |
| JP | 2009-170825 | 7/2009 |
| JP | 2009-532900 A | 9/2009 |
| JP | 2009-224536 A | 10/2009 |
| JP | 2010-007013 A | 1/2010 |
| JP | 2010-092956 A | 4/2010 |
| JP | 2010-103404 | 5/2010 |
| JP | 2010-135277 A | 6/2010 |
| JP | 2010-206015 A | 9/2010 |
| JP | 2010-226093 A | 10/2010 |
| JP | 2010-239043 A | 10/2010 |
| JP | 2011-096793 A | 5/2011 |
| JP | 2011-127011 | 6/2011 |
| JP | 2011-134508 | 7/2011 |
| KR | 10-0705552 | 4/2007 |
| KR | 10-2007-0084959 | 8/2007 |
| KR | 10-2007-0100124 | 10/2007 |
| KR | 10-2010-0079970 | 7/2010 |
| KR | 10-2010-0086955 | 8/2010 |
| KR | 10-2011-0111243 | 10/2011 |
| TW | 2008/21371 A | 5/2008 |
| TW | 2009/03859 A | 1/2009 |
| TW | 2011/09370 A | 3/2011 |
| WO | WO 2004/077580 A2 | 9/2004 |
| WO | WO 2009-107052 | 9/2009 |
| WO | WO 2010-113852 | 10/2010 |
| WO | WO 2011-109097 | 9/2011 |
| WO | WO 2013-013154 | 1/2013 |
| WO | WO 2013-082445 | 6/2013 |
| WO | WO 2013-085793 | 6/2013 |
| WO | WO 2013-085816 | 6/2013 |
| WO | WO 2013/0101385 | 7/2013 |

(56) References Cited

OTHER PUBLICATIONS

"SCS Electronic Coatings," Specialty Coating Systems, 2010, pp. 1-4, Indianapolis, IN, USA.
U.S. Appl. No. 12/757,891, filed Apr. 9, 2010.
Ming Ma, et al., Effects of the refractive index of the encapsulant on the light-extraction efficiency of light-emitting diodes, Optics Express, Sep. 12, 2011, pp. A1135-A1140, vol. 19, No. S5.
U.S. Appl. No. 13/309,117, filed Dec. 1, 2011.
U.S. Appl. No. 13/312,508, filed Dec. 6, 2011.
U.S. Appl. No. 13/312,518, filed Dec. 6, 2011.
U.S. Appl. No. 13/372,063, filed Feb. 13, 2012.
U.S. Appl. No. 13/372,076, filed Feb. 13, 2012.
U.S. Appl. No. 13/444,394, filed Apr. 11, 2012.
U.S. Appl. No. 13/444,399, filed Apr. 11, 2012.
U.S. Appl. No. 13/554,769, filed Jul. 20, 2012.
International Search Report and Written Opinion for Application No. PCT/US2012/047608 dated Jan. 31, 2013.
International Search Report and Written Opinion for Application No. PCT/US2012/067323 dated Mar. 15, 2013.
International Search Report and Written Opinion for Application No. PCT/US2012/067326 dated Mar. 15, 2013.
International Search Report and Written Opinion for Application No. PCT/US2012/067055 dated Mar. 28, 2013.
International Search Report and Written Opinion for Application No. PCT/US2012/067058 dated Mar. 29, 2013.
Non-Final Office Action for U.S. Appl. No. 13/309,177 dated Sep. 11, 2014.
Final Office Action for U.S. Appl. No. 13/554,769 dated Oct. 16, 2014.
Final Office Action for U.S. Appl. No. 13/312,518 dated Nov. 24, 2014.
Non-Final Office Action for U.S. Appl. No. 13/444,399 dated Nov. 14, 2014.
Japanese Office Action for Application No. 2014/521828 dated Jan. 6, 2015.
Final Office Action for U.S. Appl. No. 13/444,394 dated Jan. 15, 2015.
Taiwanese Office Action for Application No. 101126247 dated Dec. 19, 2014.
Restriction Requirement for U.S. Appl. No. 13/372,076 dated Jan. 31, 2013.
Non-Final Office Action for U.S. Appl. No. 13/372,076 dated Aug. 8, 2013.
Restriction Requirement for U.S. Appl. No. 13/309,177 dated Sep. 16, 2013.
Non-Final Office Action for U.S. Appl. No. 13/309,177 dated Feb. 13, 2014.
Non-Final Office Action for U.S. Appl. No. 13/312,518 dated Feb. 28, 2014.
Non-Final Office Action for U.S. Appl. No. 13/554,769 dated Mar. 18, 2014.
Restriction Requirement for U.S. Appl. No. 13/372,063 dated Apr. 10, 2014.
Non-Final Office Action for U.S. Appl. No. 13/372,076 dated Mar. 18, 2014.
Non-Final Office Action for U.S. Appl. No. 13/312,518 dated Jul. 17, 2014.
Non-Final Office Action for U.S. Appl. No. 13/444,394 dated Jul. 22, 2014.
Non-Final Office Action for U.S. Appl. No. 13/372,063 dated Jul. 28, 2014.
Final Office Action for U.S. Appl. No. 13/312,508 dated Aug. 20, 2014.
Restriction Requirement for U.S. Appl. No. 13/554,769 dated Oct. 9, 2013.
Non-Final Office Action for U.S. Appl. No. 13/312,508 dated Dec. 17, 2013.
Notice of Allowance for U.S. Appl. No. 13/372,076 dated Oct. 7, 2014.
Notice of Allowance for U.S. Appl. No. 13/372,063 dated Oct. 8, 2014.
Notice of Allowance for U.S. Appl. No. 13/372,063 dated Jan. 22, 2015.
Non-Final Office Action for U.S. Appl. No. 13/444,399 dated Aug. 27, 2015.
Notice of Allowance for U.S. Appl. No. 13/444,394 dated Sep. 11, 2015.
Final Office Action for U.S. Appl. No. 13/309,177 dated Nov. 16, 2015.
Non-Final Office Action for U.S. Appl. No. 13/312,508 dated Nov. 17, 2015.
Non-Final Office Action for U.S. Appl. No. 13/312,518 dated Dec. 3, 2015.
Final Office Action for U.S. Appl. No. 13/554,769 dated Dec. 4, 2015.
Notice of Allowance for U.S. Appl. No. 13/444,399 dated Jan. 15, 2016.
"Press Release Nichia Corporation" posted to http://www.nichia.com/en/about_nichia/2010/2010_110201.html on Nov. 2, 2010, captured by Wayback Machine on Dec. 1, 2011, accessed on Nov. 7, 2014.
Non-Final Office Action for U.S. Appl. No. 13/312,518 dated Mar. 13, 2015.
Narukawa et al. "White light emitting diodes with super-high luminous efficacy", Journal of Physics D, 43 (2010) 354002.
Advisory Action for U.S. Appl. No. 13/554,769 dated Jan. 5, 2015.
Korean Office Action for Application No. 10-2014-7004030 dated Feb. 9, 2015.
Non-Final Office Action for U.S. Appl. No. 13/312,508 dated Feb. 18, 2015.
Non-Final Office Action for U.S. Appl. No. 13/309,177 dated Apr. 23, 2015.
Non-Final Office Action for U.S. Appl. No. 13/554,769 dated Apr. 27, 2015.
Final Office Action for U.S. Appl. No. 13/444,399 dated Apr. 28, 2015.
Japanese Office Action for Application No. 2014-545949 dated May 19, 2015.
Notice of Allowance for U.S. Appl. No. 13/444,394 dated Jun. 5, 2015.
Korean Office Action for Application No. 10 2014 7018692 dated Jun. 9, 2015.
Korean Office Action for Application No. 10 2014 7018718 dated Jun. 10, 2015.
Supplementary European Search Report for Application No. EP 12855245 dated Jun. 12, 2015.
Extended European Search Report for Application No. EP 12863904 dated Jun. 22, 2015.
Extended European Search Report for Application No. EP 12853831 dated Jun. 22, 2015.
Notice of Allowance for U.S. Appl. No. 13/444,394 dated Jun. 29, 2015.
Final Office Action for U.S. Appl. No. 13/312,508 dated Jul. 22, 2015.
Final Office Action for U.S. Appl. No. 13/312,518 dated Aug. 4, 2015.
Non-Final Office Action for U.S. Appl. No. 13/554,769 dated Jan. 18, 2017.
Chinese Office Action for Application No. 2012800690449 dated Nov. 16, 2016.
Non-Final Office Action for U.S. Appl. No. 13/312,518 dated Nov. 30, 2016.
Final Office Action for U.S. Appl. No. 13/309,177 dated Dec. 21, 2016.
Chinese Notice of Allowance for Application No. 201280060437 dated Dec. 29, 2016.
Chinese Office Action for Application No. 201280060437 dated Jul. 22, 2016.
Chinese Office Action for Application No. 2012800440227 dated Aug. 9, 2016.
First Chinese Office Action for Application No. 2012 800 440 227 dated Jan. 15, 2016.

(56) References Cited

OTHER PUBLICATIONS

Advisory Action for U.S. Appl. No. 13/309,177 dated Feb. 12, 2016.
Chinese Office Action for Application No. 2012 800604373 dated Feb. 15, 2016.
Advisory Action for U.S. Appl. No. 13/554,769 dated Mar. 24, 2016.
Chinese Office Action for Application No. 2012 800 690 449 dated Apr. 6, 2016.
Chinese Office Action for Application No. 201280068933 dated May 27, 2016.
Final Office Action for U.S. Appl. No. 13/312,518 dated Jun. 1, 2016.
Non-Final Office Action for U.S. Appl. No. 13/554,769 dated Jun. 10, 2016.
Non-Final Office Action for U.S. Appl. No. 13/309,177 dated Jun. 9, 2016.
Chinese Office Action for Application No. 201280068934 dated Jun. 14, 2016.
Examiner-Initiated Interview Summary for U.S. Appl. No. 13/312,508 dated Jul. 1, 2016.
Notice of Allowance for U.S. Appl. No. 13/312,508 dated Jul. 1, 2016.
Chinese Office Action for Application No. 2012800440227 dated Feb. 24, 2017.
Non-Final Office Action for U.S. Appl. No. 13/309,177 dated Apr. 11, 2017.
Chinese Office Action for Application No. 2012800690449 dated May 27, 2017.
Chinese Notice of Allowance for Chinese Application No. 201280044022.7 dated Sep. 27, 2017.
Advisory Action for U.S. Appl. No. 13/554,769 dated Oct. 13, 2017.
Final Office Action for U.S. Appl. No. 13/309,177 dated Oct. 20, 2017.
Final Office Action for U.S. Appl. No. 13/554,769 dated Aug. 9, 2017.
Notice of Allowance with Inteview Summary for U.S. Appl. No. 13/312,518 dated Sep. 18, 2017.
Chinese Office Action for Chinese Application No. 201280069044.9 dated Jan. 2, 2018.
Advisory Action for U.S. Appl. No. 13/309,177 dated Jan. 24, 2018.
Non-Final Office Action for U.S. Appl. No. 13/544,769 dated Mar. 7, 2018.
Non-Final Office Action for U.S. Appl. No. 13/309,177 dated Apr. 6, 2018.
Notice of Allowance for U.S. Appl. No. 13/554,769 dated Jul. 26, 2018.
"Diameter_Definition of Diameter by Merriam-Webster", accessed at http://www.merriam-webster.com/dictionary/diameter on Nov. 22, 2016.
Notice of Allowance for U.S. Appl. No. 13/554,769 dated Jul. 25, 2019.
Japanese Search Report for Application No. 2014-521828 dated Dec. 26, 2014; retrieved from Global Dossier on Oct. 16, 2018.
Decision of Refusal for Japanese Application No. 2014-521828 dated Aug. 18, 2015.
Korean Office Action for Application No. 10-2014-7004030 dated Sep. 22, 2015.
First Search for Chinese Application No. 201280044022.7 dated Jan. 6, 2016; retrieved from Global Dossier on Oct. 16, 2018.
First Search for Chinese Application No. 201280068934 dated Jun. 3, 2016; retrieved from Global Dossier on Oct. 16, 2018.
Notice of Allowance for U.S. Appl. No. 13/309,177 dated Oct. 4, 2018.
Non-Final Office Action for U.S. Appl. No. 16/263,191 dated Apr. 30, 2020.

* cited by examiner

LIGHT EMITTER DEVICES AND COMPONENTS WITH IMPROVED CHEMICAL RESISTANCE AND RELATED METHODS

CROSS-REFERENCE TO RELATED APPLICATIONS

This application claims priority to U.S. Provisional Patent Application Ser. No. 61/576,764 filed, Dec. 16, 2011. This application also relates to and is a continuation-in-part from U.S. application Ser. No. 13/309,177 filed on Dec. 1, 2011, the disclosure of which is hereby incorporated by reference in its entirety. This application is also a continuation-in-part from and claims priority to U.S. patent application Ser. No. 13/554,769, filed Jul. 20, 2012, which claims priority to U.S. Provisional Patent Application Ser. No. 61/510,310, filed Jul. 21, 2011, the disclosures of which are hereby incorporated by reference the entirety.

TECHNICAL FIELD

The subject matter herein relates generally to light emitter devices, components and methods. More particularly, the subject matter herein relates to light emitter devices, components and methods with improved resistance to chemicals and/or chemical vapors or gases that can adversely affect the brightness and reliability of such devices.

BACKGROUND

Light emitting diodes (LEDs) or LED chips, can be utilized in light emitter devices or packages for providing white light (e.g., perceived as being white or near-white), and are developing as replacements for incandescent, fluorescent, and metal halide high-intensity discharge (HID) light products. Conventional light emitter devices or packages can incorporate components such as metallic traces or mounting surfaces which can become tarnished, corroded, or otherwise degraded when exposed to various undesirable chemicals and/or chemical vapors. Such chemicals and/or chemical vapors can enter conventional light emitter devices, for example, by permeating an encapsulant filling material disposed over such components. In one aspect, undesirable chemicals and/or chemical vapors can contain sulfur, sulfur-containing compounds (e.g., sulfides, sulfites, sulfates, $SO_x$), chlorine and bromine containing complexes, nitric oxide or nitrogen dioxides (e.g., $NO_x$), and oxidizing organic vapor compounds which can permeate the encapsulant and physically degrade various components within the light emitter device via corroding, oxidizing, darkening, and/or tarnishing such components. Such degradation can adversely affect brightness, reliability, and/or thermal properties of conventional light emitter devices over time, and can further adversely affect the performance of the devices during operation.

Despite the availability of various light emitter devices in the marketplace, a need remains for devices and components having improved chemical resistance and related methods for preventing undesirable chemicals and/or chemical vapors from reaching and subsequently degrading components within the devices. Devices, components, and methods described herein can advantageously improve chemical resistance to undesirable chemicals and/or chemical vapors within encapsulated light emitter devices, while promoting ease of manufacture and increasing device reliability and performance in high power and/or high brightness applications. Described devices and/or methods can be used and applied to create chemically resistant surface mount device (SMD) type of light emitter devices of any size, thickness, and/or dimension.

Devices, components, and methods described herein can advantageously be used and adapted within any style of light emitter device, for example, devices including a single LED chip, multiple LED chips, and/or multi-arrays of LED chips and/or devices incorporating different materials for the body or submount such as plastic, ceramic, glass, aluminum nitride (AlN), aluminum oxide ($Al_2O_3$), printed circuit board (PCB), metal core printed circuit board (MCPCB), and aluminum panel based devices. Notably, devices, components, and methods herein can prevent degradation of optical and/or thermal properties of devices or packages incorporating silver (Ag) components and/or Ag-plated components by preventing tarnishing of the Ag or Ag-plated components.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1:
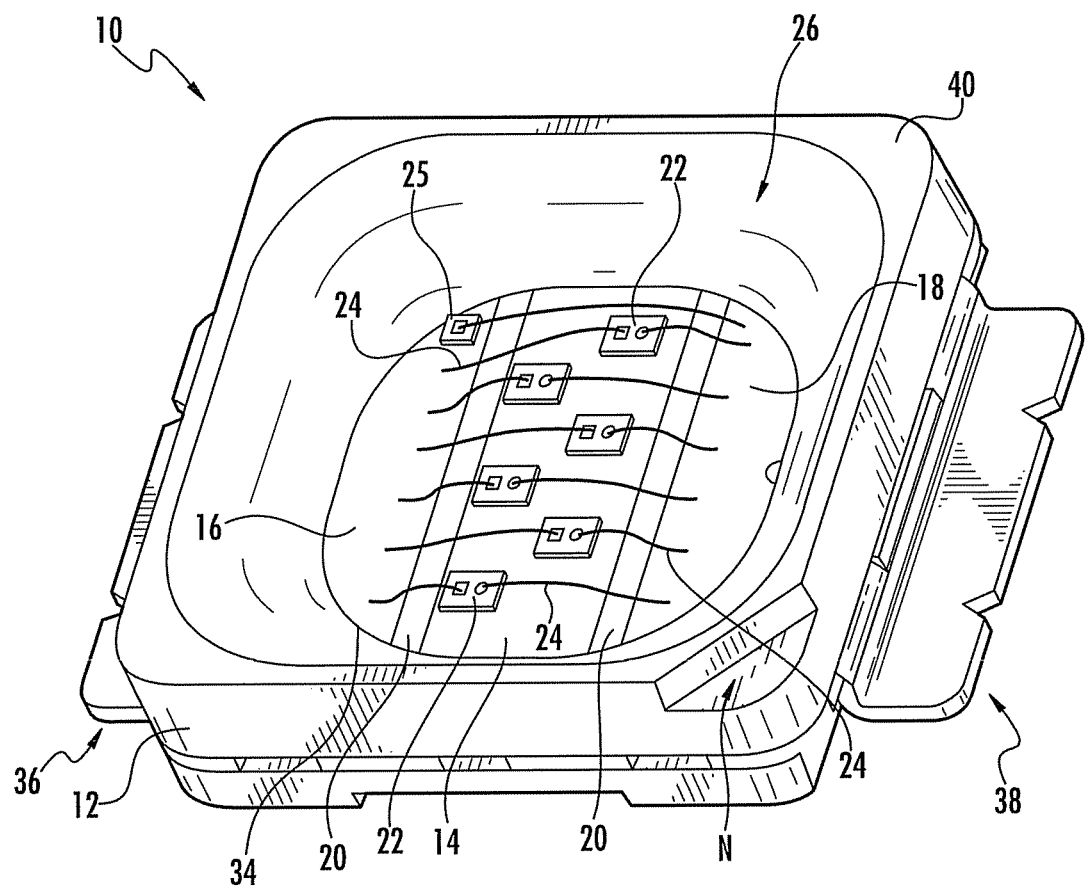
FIG. 1 is a top perspective view of a first embodiment of a light emitter device according to the disclosure herein.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Unless the absence of one or more elements is specifically recited, the terms "comprising," including," and "having" as used herein should be interpreted as open-ended terms that do not preclude the presence of one or more elements.

Light emitting diodes (LEDs) or LED chips according to embodiments described herein can comprise group III-V nitride (e.g., gallium nitride (GaN)) based LED chips or lasers that can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si) and GaN. In one aspect, SiC substrates/layers can be 4H polytype silicon carbide substrates/layers. Other Sic candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. Nos. 4,946,547; and 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature.

Although various embodiments of LED chips disclosed herein comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LED chips according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED chip). Moreover, the growth substrate can be maintained on the LED chip after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wire bonded. A vertical device (with or without the growth substrate) can have a first terminal solder bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

As described further, one or more LED chips can be at least partially coated with one or more phosphors. The phosphors can absorb a portion of the LED chip emission and in turn emit light having a different wavelength of light such that the light emitter device or package emits a combination of light from each of the LED chip and the phosphor. In one embodiment, the light emitter device or package emits what is perceived as white light resulting from a combination of light emission from the LED chip and the phosphor. One or more LED chips can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties.

Other suitable methods for coating one or more LED chips are described in U.S. patent application Ser. No. 12/014,404 entitled "Phosphor Coating Systems and Methods for Light Emitting Structures and Packaged Light Emitting Diodes Including Phosphor Coating" and the continuation-in-part application U.S. patent application Ser. No. 12/717,048 entitled "Systems and Methods for Application of Optical Materials to Optical Elements", the disclosures of which are hereby incorporated by reference herein in their entireties. LED chips can also be coated using other methods such electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that light emitter devices, components, and methods according to the present subject matter can also have multiple LED chips of different colors, one or more of which can be white emitting.

Referring now to FIGS. 1 to 12, FIGS. 1 and 2 illustrate respective top and sectional views of one example of a light emitter package or light emitter device, generally designated 10. In one aspect, light emitter device 10 can comprise a surface mount device (SMD) comprising a body 12 which can be molded or otherwise formed about one or more electrical leads. SMD types of light emitter packages or devices can be suitable for general LED illumination applications, such as indoor and outdoor lighting, automotive lighting, and preferably suitable for high power and/or high brightness lighting applications. The subject matter disclosed herein can be suitably adapted for application within a wide range of SMD type emitters and designs, not limited to dimensional and/or material variations. Notably, devices, components, and methods disclosed herein can maintain or exceed brightness levels associated with device 10 even in the presence of harmful chemicals, chemical vapors, or complexes by provision of a protective barrier or protective layer P (FIG. 2) adapted to prevent harmful chemicals or complexes from tarnishing and/or otherwise degrading components within device 10.

In one aspect, a body 12 can be disposed about a leadframe, also referred to as "leads", which can comprise a thermal element 14 and one or more electrical elements. In some aspects, body 12 can comprise a plastic body molded about the leads. Electrical elements can include for example, first and second electrical elements 16 and 18, respectively. That is, thermal element 14 and electrical elements 16 and 18 can be collectively referred to as "leads" and can be singulated from a sheet of leadframes (not shown). A corner notch, generally designated N can be used for indicating electrical polarity of first and second electrical elements 16 and 18.

In some aspects, thermal element 14 and first and second electrical elements 16 and 18 can comprise a material that is electrically and/or thermally conductive such as a metal or metal alloy. In one aspect, thermal element 14 can be electrically and/or thermally separated from one and/or both of first and second electrical elements 16 and 18 by one or more insulating or isolating portions 20 of the body. In some aspects, one or more LEDs or LED chips 22 can be mounted over thermal element 14 using any suitable die attach technique(s) and/or material(s), for example only and not limited to die attach adhesive (e.g., silicone, epoxy, or conductive silver (Ag) epoxy) or a metal-to-metal die attach technique such as flux or no-flux eutectic, non-eutectic, or thermal compression die attach.

In some aspects, multiple LED chips 22 can electrically communicate with one and/or both first and second electrical elements 16 and 18 via one or more electrical connectors such as electrically conductive wire bonds 24. In some aspects, each LED chip 22 within a plurality of LED chips 22 can be electrically connected in parallel. For illustration purposes only, LED chips 22 having two electrical contacts on the same side (e.g., upper surface) are shown as electrically connected to two electrical elements (e.g., 16 and 18) via wire bonds 24. However, LED chips 22 with two electrical contacts on a lower surface, such that wire bonds 24 are unnecessary, are also contemplated herein. In further embodiments, LED chips 22 having one electrical contact on the upper surface that is electrically connected with a single electrical element is also contemplated. Any type or style of LED chip 22 can be used in device 10, for example, LED chip 22 can comprise a horizontally structured chip (e.g., having at least two electrical contacts on a same side of the LED) or a vertically structured chip (e.g., with electrical contacts on opposing sides of the LED) with or without a growth substrate.

In some aspects, LED chips 22 can comprise one or more substantially straight cut and/or beveled (i.e., angled) cut sides or surfaces. LED chips 22 can comprise a direct attach build (e.g., bonded to a carrier substrate) or a build incorporating a grown substrate such as sapphire, SiC, or GaN. LED chips 22 having any build, structure, type, style, shape, and/or dimension are contemplated herein. Wire bonds 24 or other electrical attachment connectors are optional to device designs and can be adapted to communicate, transmit, or convey an electrical current or signal from electrical elements 16 and 18 to one or more LED chips 22 thereby causing illumination of the one or more LED chips 22. In some aspects, portions of thermal element 14 and/or first and second electrical elements 16 and 18, respectively, can be coated, plated, deposited, or otherwise layered with a reflective material (FIG. 2), such as, for example and without limitation, Ag or a Ag-containing alloy for reflecting light from the one or more LED chips 22.

In some aspects, body 12 can comprise any suitable material molded or otherwise disposed about portions of thermal element 14 and/or first and second elements 16 and 18, respectively. In some aspects, body 12 can comprise a ceramic material such as a low temperature co-fired ceramic (LTCC) material, a high temperature co-fired ceramic (HTCC) material, alumina, aluminum nitride (AlN), aluminum oxide ($Al_2O_3$), glass, and/or an Al panel material. In other aspects, body 12 can comprise a molded plastic material such as polyamide (PA), polyphthalamide (PPA), liquid crystal polymer (LCP) or silicone.

In some aspects, at least one electrostatic discharge (ESD) protection device 25 can be disposed within device 10 and can be electrically connected to electrical elements 16 and 18 reverse biased with respect to LED chips 22. ESD device 25 can protect against damage from ESD within device 10. In one aspect, different elements can be used as ESD protection devices 25 such as various vertical or horizontal silicon (Si) Zener diodes, different LED chips arranged reverse biased to LED chips 22, surface mount varistors and lateral Si diodes. As illustrated, ESD device 25 can comprise a vertically structured device having one electrical contact on the bottom and another electrical contact on the top; however, horizontally structured ESD protection devices can also be provided.

Figure 2:
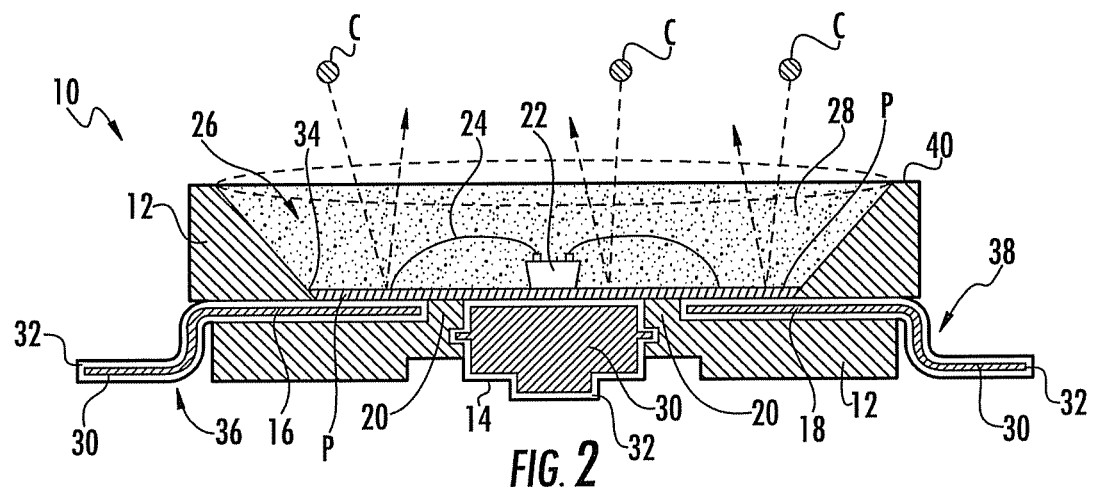
FIG. 2 is a cross-sectional view of the first embodiment of the light emitter device according to the disclosure herein.

Still referring to FIGS. 1 and 2 and in some aspects, body 12 of device 10 can comprise a cavity, generally designated 26, for example, a reflector cavity optionally coated with a reflective material for reflecting light from the one or more LED chips 22. As FIG. 2 illustrates, cavity 26 can be filled at least partially or completely with a filling material, such as an encapsulant 28. In some aspects, encapsulant 28 can optionally comprise one or more phosphor materials adapted to emit light of a desired wavelength when activated by light emitted from the one or more LED chips 22. Thus, in some aspects, device 10 can emit light having a desired wavelength or color point that can be a combination of light emitted from phosphors disposed in encapsulant 28 and from the light emitted from one or more LED chips 22.

In some aspects as illustrated in FIG. 2, thermal element 14 and first and second electrical elements 16 and 18 can comprise an inner portion 30 and an outer portion 32. In some aspects, inner portion 30 and outer portion 32 can comprise electrically and/or thermally conductive materials. Outer portion 32 may be applied such that it entirely surrounds inner portion 30 as shown, or in other aspects outer portion 32 can partially plate, coat, or comprise a partial layer or coating over a single surface or two or more surfaces of inner portion 30.

In one aspect, outer portion 32 can comprise a highly reflective Ag substrate, a substrate containing Ag, or a layer of material such as Ag or a Ag-alloy for maximizing light output from device 10 and for assisting in heat dissipation by conducting heat away from the one or more LED chips 22. Outer portion 32 can also comprise a substrate of Ag-containing alloy instead of pure Ag, and such alloy can optionally contain other metals such as titanium (Ti) or nickel (Ni). Inner portion 30 can comprise a metal or metal alloy such as a copper (Cu) substrate or a Cu-alloy substrate. In one aspect, an optional layer of material (not shown) can be disposed between inner portion 30 and outer portion 32, such as a layer of Ni for providing a barrier between the Ag and Cu, thereby preventing defects caused by migratory Cu atoms, such as a defect commonly known as "red plague".

In some aspects, outer portion 32 can be directly attached to and/or directly coat inner portion 30. Outer portion 32 can advantageously reflect light emitted from the one or more LED chips 22 thereby improving optical performance of device 10. Upper surfaces of thermal element 14 and electrical elements 16 and 18 can be disposed along a floor 34 of cavity 26 such that respective upper surfaces of thermal and electrical elements are disposed along the same plane and/or different planes. First and second electrical elements 16 and 18 can extend from one or more lateral sides of body 12 and form one or more external tab portions, generally designated 36 and 38. Tab portions 36 and 38 can bend to form one or more lower mounting surfaces such that device 10 can be mounted to an underlying substrate. Tab portions 36 and 38 can outwardly bend away from each other or inwardly bend towards each other thereby adapting either a J-bend or gull-wing orientation as known in the art. However, any configuration of external tabs 36 and 38 can be provided.

Still referring to FIG. 2, a filling material can be disposed and filled to any level within cavity 26 and may be partially disposed below and/or above a top surface 40 of device 10. In one aspect, filling material can comprise an encapsulant 28 that it is filled to a level flush with top surface 40 of device as shown. In other aspects, encapsulant 28 can be filled such that it forms a concave or convex surface with respect to top surface 40 of device 10 as indicated in broken lines adjacent portions of top surface 40. In one aspect, encapsulant 28 can be adapted for dispensing within cavity 26. In some aspects, encapsulant 28 can comprise a selective and optional amount of one or more phosphors adapted to emit light or combinations of light when activated by light emission from the one or more LED chips 22 thereby emitting light of any desired color point or color temperature. In one aspect, encapsulant 28 can comprise a silicone material, such as a methyl or phenyl silicone encapsulant.

Typically, SMD type devices, such as device 10, do not have secondary optics (e.g., a secondary lens) for preventing harmful chemicals or complexes from permeating the device and thereby degrading Ag or Ag-alloyed outer portions 32 of thermal and/or electrical elements. In some aspects, encapsulant 28 can provide physical protection against foreign solids and liquids, but may not provide adequate protection against gaseous chemicals or airborne elements such as sulfur, oxygen, or moisture which can tarnish or otherwise degrade outer portion 32 where outer portion comprises Ag (e.g., pure Ag, Ag-alloys, or Ag plating). In some aspects, Ag-containing components such as outer portion 32 of thermal and electrical elements 14, 16, and 18 can over time become tarnished, corroded, or otherwise degraded where the device 10 has poor chemical resistance. This can decrease the brightness of device 10.

In some aspects, undesirable chemicals, vapors, or complexes C can permeate encapsulant 28 and potentially interact with outer portion 32 of elements, for example, by tarnishing such elements thereby resulting in degradation to optical, physical, electrical, and/or thermal properties such as a loss in brightness output and the noticeable darkening of surfaces along cavity floor 34. In this embodiment, undesirable chemical vapors or complexes C can permeate the encapsulant 28 as indicated by the broken and arrowed trajectory lines shown in FIG. 2 and could potentially adversely affect outer portion 32 if not deflected from surfaces within the device as shown. Notably, the current subject matter can improve the chemical resistance of device 10 by incorporating a protective layer P serving as a protective barrier or barrier layer disposed over one or more surfaces of device 10, within device 10, and/or over components of device 10 to prevent complexes C from reaching, interacting with, and/or adversely affecting components such as Ag-containing outer portion 32 of thermal and electrical elements 14, 16, and 18.

As FIG. 2 illustrates, and in one aspect, protective layer P can be directly disposed over outer portion 32 of elements as shown and along cavity floor 34. In some aspects, protective layer P can be applied prior to attaching the one or more LED chips 22 to thermal element 14 such that protective layer P can be disposed between portions of LED chip 22 and outer portion 32 of thermal/electrical components or elements. Protective layer P can be used either alone or in combination with a phenyl silicone encapsulant for improving the chemical resistance of light emitter devices as described herein. FIGS. 4 to 12 illustrate various other devices and/or alternative locations or placement of protective layer P for providing protection against chemical complexes C within light emitter devices or packages.

In some aspects, undesired chemicals, vapors, or complexes C can comprise chemical vapors containing sulfur, sulfur containing compounds (sulfides, sulfites, sulfates, $SO_x$), chlorine or bromine containing complexes, nitric oxide or nitrogen dioxide ($NO_x$), and/or oxidizing organic vapor compounds. Complexes C can degrade the Ag components (e.g., outer portion 32 of thermal/electrical elements) and result in a loss of brightness output and noticeable darkening of surfaces within the device. Improved devices as described herein can incorporate one or more protective layers P for improving the chemical resistance of device 10 and components within device 10 such that harmful vapors, chemicals, or complexes C cannot reach Ag-containing components (e.g., outer portion 32). In some aspects, as illustrated by the dotted trajectory of complexes C, complexes C can be repelled from the surface of protective layer P, thereby minimizing the damage to reflective Ag components, and further minimizing and/or totally preventing any loss in brightness from device 10 and/or darkening of components within device 10.

In some aspects, protective layer P can be directly and/or indirectly disposed over vulnerable components within devices described herein, such as located directly or indirectly over Ag or Ag-alloy containing components. Protective layer P can be adapted for application to a variety of surfaces of components within light emitter devices which is also advantageous. In one aspect, protective layer P can be directly applied to portions of surfaces of Ag or Ag-alloy containing components (e.g., outer portions 32 of thermal element 14 and electrical elements 16, 18) alone and/or layer P can be applied to portions of surfaces of LED chips 22 including underfills, on or over wires, wire bonds 24, wire bond balls (e.g., ball formed where wire 24 attaches to LED chip 22), and on surfaces of the LED housing or body all of which, when comprising a portion or layer of Ag over the surface, can comprise Ag-containing components.

In some aspects, protective layer P can be applied over internal and/or external portions of the ceramic or plastic body 12 of light emitter device 10, for example, over isolating portions 20 of body 12 (FIG. 2). Notably, protective layer P can be selectively applied at and/or parallel to any number of processing steps within the manufacturing process (e.g., before/after die attachment of LED, before/during encapsulation, see FIGS. 4 to 12) for providing broad protection against chemical vapors, such as but not limited to, nitric oxide or nitrogen dioxide ($NO_x$), oxidizing organic vapor compounds, sulfur, sulfur-containing compounds (e.g., sulfides, sulfates, $SO_x$) and chlorine- or bromine-containing complexes.

Notably, when a protective layer P is incorporated within a device, such devices can exhibit excellent and/or improved chemical, including improved resistance to sulfur, as well as long lasting protection against chemical complexes C as compared to conventional devices. In one aspect, improved devices, such as device 10, can for example retain approximately 95% or more of their initial brightness values (e.g., measured in lumens) when exposed to a sulfur environment as compared to conventional devices which may only retain approximately 60% of their initial brightness values when exposed to the same sulfur environment. Depending on the level of sulfur present and severity of the environment, improved devices such as device 10 can retain approximately 96%, 97%, 98%, 99%, and/or approximately 100% of their initial brightness values.

Devices using or adapted for use with LEDs, such as for example and without limitation those described herein, can comprise a protective barrier or protective layer P. Protective layer P is not limited in application or use, and can be used, for example, in devices comprising ceramic, plastic, PCB, MCPCB, or laminate substrates or submounts and can advantageously be applied over multiple surfaces, including LED chips 22 disposed within the SMDs. Protective layer P can at least partially comprise an organic material for increasing chemical resistance of the substrate. The organic material can comprise for example an organic coating or film deposited using chemical vapor deposition (CVD) techniques and where protective layer P can be of any suitable thickness.

In some aspects, protective layer P can comprise a thickness of between approximately 1 nm and approximately 100 μm. Any sub-range of thickness between approximately 1 nm and 100 μm is also contemplated herein, and can be provided within devices described herein. For example and without limitation, the thickness of protective layer P can comprise approximately 1 to 10 nm; approximately 10 nm to 50 nm; approximately 50 nm to 200 nm; approximately 200 nm to 400 nm; approximately 400 to 600 nm; approximately 600 to 800 nm; approximately 800 nm to 1 μm; approximately 0.5 μm to 1 μm; approximately 1 μm to 5 μm; approximately 5 μm to 10 μm; approximately 10 μm to 50 μm; or approximately 50 μm to 100 μm. In some aspects, protective layer P can comprise a thickness of approximately 0.7 to 1.0 μm. In some aspects, a thicker protective layer P can provide superior barrier protection of Ag components against harmful chemical complexes C, thereby improving the brightness retention of light emitter device 10.

In some aspects, protective layer P can comprise a barrier layer of poly(p-xylylene) polymers (e.g., such as Parylene) deposited via CVD processing techniques and polymerized in-situ to form a protective polymer coating or protective layer P. Parylene materials, including PARYLENE HT®, are commercially available for example from Specialty Coating Systems™ (SCS) headquartered in Indianapolis, Ind. In some aspects, protective layer P can be highly efficient in repelling or preventing harmful chemicals and vapors from permeating the device thereby protecting components comprised of one or more of Ag or Ag-containing portions within device 10 from tarnishing, corroding, or otherwise degrading. Any other reactive organic barrier coating can be deposited directly on or over Ag or Ag-containing portions of components within device 10. Such coatings can be applied via CVD processing and can polymerize in-situ, preferably at room temperature. In some aspects, poly(p-xylylene) polymer or Parylene layers may be preferred for thermal stability purposes; as such materials can comprise a fluorocarbon-containing organic barrier coating even though not all Parylene coatings or layers are fluorocarbons. Other variations of fluorocarbon containing coatings can also comprise effective barrier coatings.

In some aspects, protective layer P can comprise an organic barrier coating comprising an aromatic polymer or copolymer or a polymer or copolymer prepared using aromatic precursors. In some aspects, protective layer P can comprise an organic barrier coating resistant to chemical vapors and gases, such as sulfur. In some aspects, protective layer P can comprise an organic barrier layer having a thermal stability in air of approximately 100° C. or greater (e.g., approximately 100, 150, 200, 250, 300, 350, or 400° C. or greater). In some aspects, protective layer P can comprise arylene and/or aralkylene monomer units (e.g., phenylene, napthylene, xylene, etc.) or monomer units (e.g., cycloaliphatic monomer units) derived from aryl or aralkyl polymer precursors. The arylene and/or aralkylene monomer units can be unsubstituted or can be substituted by one or more aryl or alkyl group substituent (e.g., alkyl, aryl, halo, nitro, alkoxy, etc.). In some aspects, the protective layer P can be a copolymer of the arylene or aralkylene monomer, further comprising one or more monomer units derived from a vinyl-containing monomer. In some aspects, the organic barrier coating can be a fluorinated aromatic or fluorinated cycloaliphatic polymer or copolymer.

In some aspects, protective layer P can comprise a polyxylylene. (e.g., poly(p-xylylene), a substituted poly(p-xylylene) polymer prepared from a xylylene and/or comprising —$CH_2$—($C_6H_4$)—$CH_2$— repeating units wherein one or more of the hydrogen atoms in the repeating unit can be replaced by an alkyl or aryl group substituent). In some aspects, the polyxylylene can have between about 10 and about 100,000 repeating units (e.g., about 10, about 50, about 100, about 500, about 1,000, about 2,500, about 5,000, about 75,000, about 10,000, about 25,000, about 50,000, about 75,000, or about 100,000 repeating units), wherein each repeating unit has an aromatic group and can be substituted or unsubstituted. Each substituent, if present, can be the same or different and can be selected from the group including, but not limited to, alkyl, aryl, alkenyl, amino, cyano, carboxyl, alkoxy, aryloxy, hydroxylalkyl, aminoalkyl, acyl, carboxyalkyl, mercapto, hydroxyl, nitro, halo, and the like.

In some aspects, the substituents, if present, can be selected from lower alkyl groups (e.g., methyl, ethyl, propyl, butyl, and hexyl) and halo groups (e.g., chloro, bromo, iodo, and fluoro). In some aspects, the organic barrier coating comprises poly(p-xylylene), poly(p-2-chloroxylylene), poly(p-2,6-dichloroxylylene) and fluoro-substituted poly(p-xylylene). In some aspects, the fluoro-substituted poly(p-xylylene) can comprise fluoro substituents on non-aromatic carbon atoms and have the structure [—$CF_2$—($C_6H_4$)—$CF_2$—]$_n$, which is PARYLENE HT®. In some aspects, the fluoro-substituted poly(p-xylylene) can comprise one or more fluoro substituents on an aromatic carbon atom or can comprise fluoro substituents on both aromatic and non-aromatic carbon atoms. In some aspects, the polyxylylene protective layer P can be a homopolymer. In other aspects, the polyxylylene protective layer P can be a copolymer of at least two different xylylene monomers.

In some aspects, the protective layer P comprises reaction products of a poly(p-xylylene) preparation process where aromatic groups in the backbone of one or more monomer units are at least partially converted to non-aromatic cyclic (or non-cyclic) groups (e.g., to cyclohexylene groups). In some aspects, the poly(p-xylylene) is a fluoro-substituted poly(p-xylylene) containing one or more monomer units wherein the backbone aromatic group has been converted to a non-aromatic cyclic group. In some aspects, the fluoro-substituted poly(p-xylylene) is PARYLENE HT® wherein the $C_6H_4$ group of one or more [—$CF_2$—($C_6H_4$)—$CF_2$—]$_n$, repeating units has been converted to a non-aromatic and/or fully saturated cyclic group.

A process for preparing polyxylylene copolymers to be deposited is described, for example, in U.S. Pat. No. 3,288,728, the contents of which are incorporated by reference herein. Typically, the process of applying the polyxylylene can include chemical vapor deposition (CVD). The process can, for example, comprise vaporizing a solid precursor compound, such as a suitable dimer (e.g., cyclo-di(p-xylene) or a substituted cyclo-di(p-xylene), such as cyclo-di(p-2-chloroxylene), cyclo-di(p-2,6-dichloroxylene), or tetra-fluoro-cyclo-di(p-xylene)). Suitable vaporization temperatures can be between about 110° C. and about 200° C. In some aspects, the vaporization temperature can be about 150° C. The vaporized precursor can subsequently be subjected to pyrolysis to provide a reactive monomer (e.g., by cleavage of the methylene-methylene bonds in the dimer precursor). Pyrolysis can be performed at temperatures between about 400° C. and about 700° C. In some embodiments, the pyrolysis can be performed at between about 650° C. and about 680° C. Following pyrolysis, the monomeric vapor can be cooled. Upon cooling, the reactive monomers can condense and copolymerize. If the vapor comprising the reactive monomer is cooled over a substrate (e.g., one or more portions, surfaces, Ag, and/or Ag-containing components of device 10), the monomers can deposit and polymerize on the substrate, thereby forming a polymer film such as protective layer P.

In some aspects, the pyrolysis of the vaporized xylylenic species stated in this application can lead to reactive species of structures that are different from xylylene monomers when performed at between about 650° C. and about 680° C. In some aspects, protective layer P subsequently derived can have different structures than the one represented by poly(p-xylylene). In some aspects, protective layer P as prepared can be substantially free of aromatic rings. In some aspects, the poly(p-xylylene) is a derivative of a poly(p-xylylene) that is partially or substantially fully non-aromatic.

In some aspects, the vapor comprising the reactive monomers can be transferred from a pyrolysis chamber to a room temperature deposition chamber where a substrate is present to cool and deposit and polymerize on a surface of the substrate. The substrate can comprise any portion of device 10 at any step in the manufacturing process. For example, protective layer P can be applied to any desired substrates or components, including the leads (e.g., thermal element 14 and electrical elements 16 and 18) prior to molding body 12 about the leads, over any and all surfaces of device 10 prior to die attaching one or more LED chips 22, over any and all surfaces before/after wirebonding the LED chips 22, and/or over any and all surfaces before/during encapsulation as described further hereinbelow. In some aspects, protective layer P can comprise a flexible continuous film. In some aspects and prior to deposition or application of protective layer P, one or more portions of device 10 can be physically or chemically masked such that protective layer P does not deposit in the masked (e.g., unwanted) areas.

As used herein the term "alkyl" can refer to $C_{1-20}$ inclusive, linear (i.e., "straight-chain"), branched, or cyclic, saturated or at least partially and in some cases fully unsaturated (i.e., alkenyl and alkynyl) hydrocarbon chains, including for example, methyl, ethyl, propyl, isopropyl, butyl, isobutyl, tert-butyl, pentyl, hexyl, octyl, ethenyl, propenyl, butenyl, pentenyl, hexenyl, octenyl, butadienyl, propynyl, butynyl, pentynyl, hexynyl, heptynyl, and allenyl groups. As used herein, the term "branched" can refer to an alkyl group in which a lower alkyl group, such as methyl, ethyl or propyl, is attached to a linear alkyl chain. As used herein, the term "lower alkyl" can refer to an alkyl group having 1 to about 8 carbon atoms (i.e., a $C_{1-8}$ alkyl), e.g., 1, 2, 3, 4, 5, 6, 7, or 8 carbon atoms. As used herein, the term "higher alkyl" can refer to an alkyl group having about 10 to about 20 carbon atoms, e.g., 10, 11, 12, 13, 14, 15, 16, 17, 18, 19, or 20 carbon atoms. In certain aspects, "alkyl" refers, in particular, to $C_{1-8}$ straight-chain alkyls. In other aspects, "alkyl" refers, in particular, to $C_{1-8}$ branched-chain alkyls.

Alkyl groups can optionally be substituted (e.g., a "substituted alkyl") with one or more alkyl group substituents, which can be the same or different. The term "alkyl group substituent" includes but is not limited to alkyl, substituted alkyl, halo, arylamino, acyl, hydroxyl, aryloxyl, alkoxyl, alkylthio, arylthio, aralkyloxyl, aralkylthio, carboxyl, alkoxycarbonyl, oxo, and cycloalkyl. There can be optionally inserted along the alkyl chain one or more oxygen, sulfur or substituted or unsubstituted nitrogen atoms, wherein the nitrogen substituent is hydrogen, lower alkyl (also referred to herein as "alkylaminoalkyl"), or aryl. Thus, as used herein, the term "substituted alkyl" includes alkyl groups, as defined herein, in which one or more atoms or functional groups of the alkyl group are replaced with one or more atoms or functional groups, including for example, alkyl, substituted alkyl, halogen, e.g., $CH_2X$, $CHX_2$, and $CX_3$, wherein X is a halogen selected from the group consisting of Cl, Br, F, and I, aryl, substituted aryl, alkoxyl, hydroxyl, nitro, amino, alkylamino, dialkylamino, sulfate, and mercapto.

As used herein, the term "alkenyl" refers to an alkyl group containing a carbon-carbon double bond. As used herein, the term "vinyl" refers to a terminal alkyl group, i.e., —CH=$CH_2$. As used herein, the term "aryl" can refer to an aromatic substituent that can be a single aromatic ring, or multiple aromatic rings that are fused together, linked covalently, or linked to a common group, such as, but not limited to, a methylene or ethylene moiety. The common linking group also can be a carbonyl, as in benzophenone, or oxygen, as in diphenylether, or nitrogen, as in diphenylamine. The term "aryl" specifically encompasses, heterocyclic aromatic compounds. However, in some embodiments, the term "aryl" refers exclusively to aromatic groups that do not include heteroatoms (e.g., O, N, S, etc.) in the backbone of the ring structure(s). The aromatic ring(s) can comprise phenyl, naphthyl, biphenyl, diphenylether, diphenylamine and benzophenone, among others. In particular embodiments, the term "aryl" means a cyclic aromatic comprising about 5 to about 10 carbon atoms, e.g., 5, 6, 7, 8, 9, or 10 carbon atoms, and including 5- and 6-membered hydrocarbon and heterocyclic aromatic rings.

The aryl group can be optionally substituted (a "substituted aryl") with one or more aryl group substituents, which can be the same or different, wherein "aryl group substituent" includes alkyl, substituted alkyl, aryl, substituted aryl, aralkyl, hydroxyl, alkoxyl, aryloxyl, aralkyloxyl, carboxyl, acyl, halo, nitro, alkoxycarbonyl, aryloxycarbonyl, aralkoxycarbonyl, acyloxyl, acylamino, aroylamino, carbamoyl, alkylcarbamoyl, dialkylcarbamoyl, arylthio, alkylthio, alkylene, and —NR'R", wherein R' and R" can each be independently hydrogen, alkyl, substituted alkyl, aryl, substituted aryl, and aralkyl.

Thus, as used herein, the term "substituted aryl" includes aryl groups, as defined herein, in which one or more atoms or functional groups of the aryl group are replaced with another atom or functional group, including for example, alkyl, substituted alkyl, halogen, aryl, substituted aryl, alkoxyl, hydroxyl, nitro, amino, alkylamino, dialkylamino, sulfate, and mercapto.

Specific examples of aryl groups include, but are not limited to, cyclopentadienyl, phenyl, napthyl, furan, thiophene, pyrrole, pyran, pyridine, imidazole, benzimidazole, isothiazole, isoxazole, pyrazole, pyrazine, triazine, pyrimidine, quinoline, isoquinoline, indole, carbazole, and the like.

"Aralkyl" refers to an aryl-alkyl-group wherein aryl and alkyl are as previously described, and included substituted aryl and substituted alkyl. Exemplary aralkyl groups include benzyl, phenylethyl, ortho-, meta-, or para-dimethylbenzene (i.e., ortho-, meta- or para-xylene), and naphthylmethyl.

"Alkylene" refers to a straight or branched bivalent aliphatic hydrocarbon group having from 1 to about 20 carbon atoms, e.g., 1, 2, 3, 4, 5, 6, 7, 8, 9, 10, 11, 12, 13, 14, 15, 16, 17, 18, 19, or 20 carbon atoms. The alkylene group can be straight, branched or cyclic. The alkylene group also can be optionally unsaturated and/or substituted with one or more "alkyl group substituents." There can be optionally inserted along the alkylene group one or more oxygen, sulfur or substituted or unsubstituted nitrogen atoms (also referred to herein as "alkylaminoalkyl"), wherein the nitrogen substituent is alkyl as previously described. Exemplary alkylene groups include methylene (—$CH_2$—); ethylene (—$CH_2$—$CH_2$—); propylene (—$(CH_2)_3$—); cyclohexylene (—$C_6H_{10}$—); —CH=CH—CH=CH—; —CH=CH—$CH_2$—; —$(CH_2)_q$—N(R)—$(CH_2)_r$—, wherein each of q and r is independently an integer from 0 to about 20, e.g., 0, 1, 2, 3, 4, 5, 6, 7, 8, 9, 10, 11, 12, 13, 14, 15, 16, 17, 18, 19, or 20, and R is hydrogen or lower alkyl; methylenedioxyl (—O—$CH_2$—O—); and ethylenedioxyl (—O—$(CH_2)_2$—O—). An alkylene group can have about 2 to about 3 carbon atoms and can further have 6-20 carbons.

The term "arylene" refers to a bivalent radical of an aryl group as previously described. Exemplary arylene groups include phenylene and napthylene. The term "aralkylene" refers to a bivalent radical of an aralkyl group as previously described and/or to combinations of alkylene and arylene groups (e.g., to alkylene-arylene-alkylene groups). Exemplary aralkylene groups include the diradicals of xylene and substituted xylenes. "Alkoxy" refers to an alkyl-O— group wherein alkyl is as previously described. The term "alkoxy" as used herein can refer to $C_{1-20}$ inclusive, linear, branched, or cyclic, saturated or unsaturated oxo-hydrocarbon chains, including, for example, methoxyl, ethoxyl, propoxyl, isopropoxyl, butoxyl, t-butoxyl, and pentoxyl. "Aryloxy" refers to an aryl-O— group wherein the aryl group is as previously described, including a substituted aryl. The term "aryloxy" as used herein can refer to phenyloxyl or hexyloxyl, and alkyl, substituted alkyl, halo, or alkoxyl substituted phenyloxyl or hexyloxyl.

As used herein, the term "acyl" refers to an organic acid group wherein the OH of the carboxyl group has been replaced with another substituent (i.e., as represented by RCO—, wherein R is an alkyl, substituted alkyl, aryl, or substituted aryl group as defined herein). In some embodiments, the term acyl can refer to the group RCO— wherein R is an amino-substituted alkyl group, an alkylamino-substituted alkyl group, a dialkylamino-substituted alkyl group, or a hydroxyl-substituted alkyl group. Thus, the term "acyl" can refer to groups such as $H_2NR_1CO$—, $R_2HNR_1CO$—, $R_3R_2NR_1CO$—, and $HOR_1CO$—, wherein $R_1$ is alkylene and $R_2$ and $R_3$ are lower alkyl. The term "acyl" also specifically includes arylacyl groups, such as an acetylfuran and a phenacyl group. Specific examples of acyl groups include acetyl and benzoyl.

"Amino" refers to an —NRR' group wherein each of R and R' is independently a hydrogen, an alkyl group and/or a substituted alkyl group as previously described, an aryl group and/or a substituted aryl group, or an aralkyl group. In some embodiments, the term "amino" refers to the —$NH_2$ group. "Carboxyalkyl" refers to an alkyl-O—CO— group. Exemplary carboxyalkyl groups include methoxycarbonyl, ethoxycarbonyl, butyloxycarbonyl, and t butyloxycarbonyl. The terms "halo", "halide", or "halogen" as used herein refer to fluoro, chloro, bromo, and iodo groups. The term "hydroxyl" refers to the —OH group. The term "hydroxyalkyl" refers to an alkyl group substituted with an —OH group. The term "cyano" refers to the —CN group. The term "nitro" refers to the —$NO_2$ group. The term "mercapto" refers to the —SH group.

Figure 3:
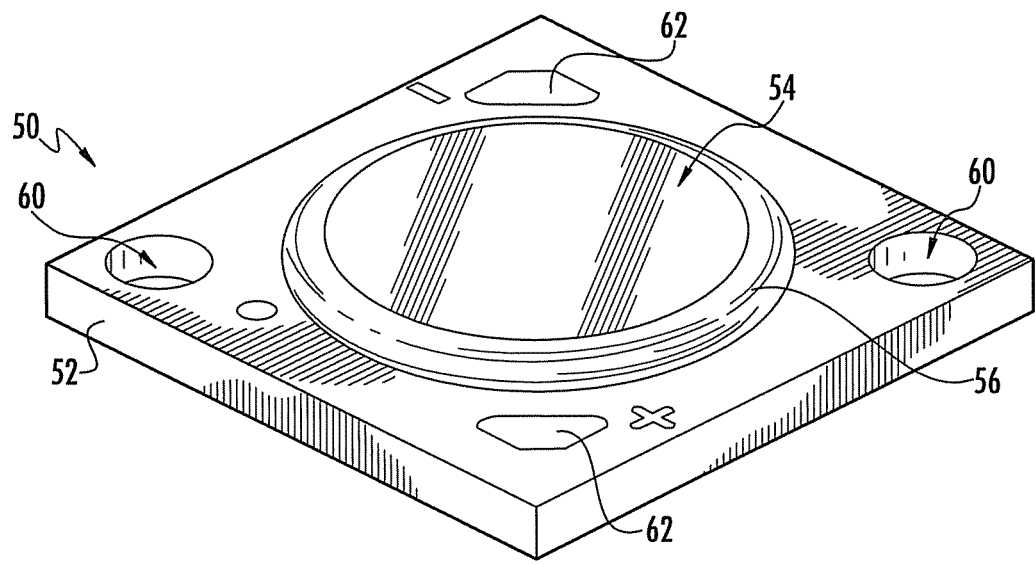
FIG. 3 is a top perspective view of a second embodiment of a light emitter device according to the disclosure herein.
Figure 4:
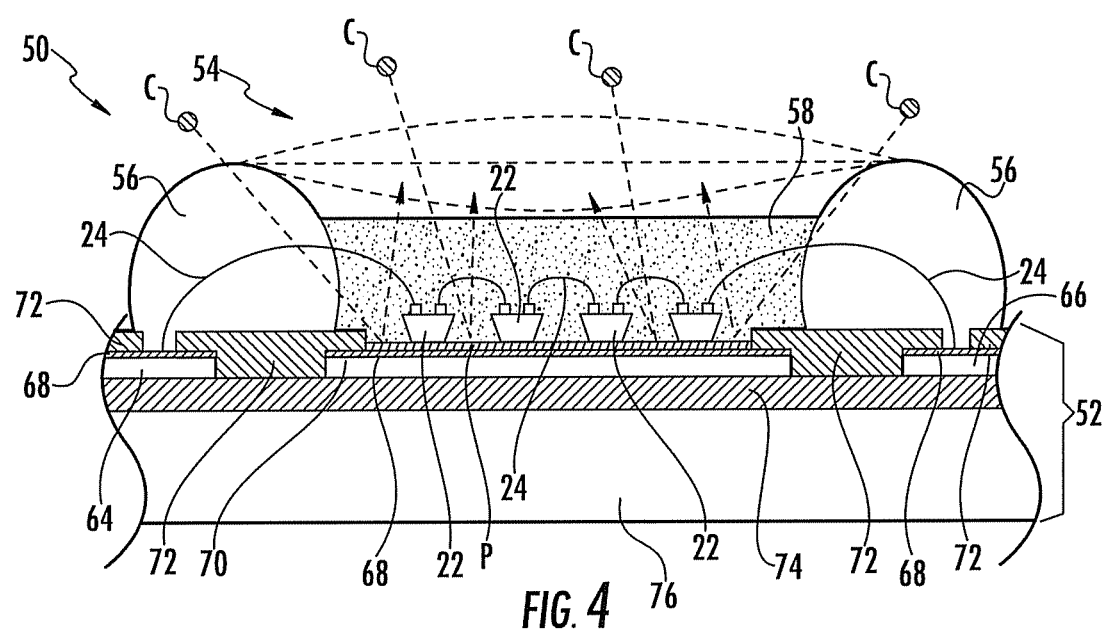
FIG. 4 is a cross-sectional view of the second embodiment of the light emitter device according to the disclosure herein.

FIGS. 3 and 4 illustrate top perspective and cross-sectional views of another embodiment of an LED package or device, generally designated 50. Light emitter device 50 can also be improved for chemical resistance by incorporating a protective layer P, for example, on external surfaces of device 50 and/or on internal surfaces of device (FIG. 4). Light emitter device 50 can comprise an SMD type device, similar to device 10 in that a secondary optics can, but may not be used. Thus, the possibility of degradation of device components exists where undesirable chemical vapors or complexes C can permeate the filling material of the device (FIG. 4).

In some aspects, light emitter device 50 can comprise a submount 52 over which an emission area, generally designated 54, can be disposed. In some aspects, emission area 54 can comprise one or more LED chips 22 disposed under a filling material, such as an encapsulant 58 (see FIG. 4). In some aspects, emission area 54 can be substantially centrally disposed with respect to submount 52 of light emitter device 50. In the alternative, emission area 54 can be disposed at any location over light emitter device 50, for example, in a corner or adjacent an edge. Any location is contemplated, and more than one emission area 54 is also contemplated.

For illustration purposes, a single, circular emission area 54 is shown; however, the number, size, shape, and/or location of emission area 54 can change subject to the discretion of light emitter device consumers, manufacturers, and/or designers. Emission area 54 can comprise any suitable shape such as a substantially circular, square, oval, rectangular, diamond, irregular, regular, or asymmetrical shape. In some aspects, light emitter device 50 can further comprise a retention material 56 at least partially disposed about emission area 54 where retention material 56 can be referred to as a "dam". Retention material 56 can comprise any material such as a silicone, ceramic, thermoplastic, and/or thermosetting polymer material. In some aspects, retention material 56 can be adapted for dispensing about emission area 54, which is advantageous as it is easy to apply and easy to obtain any desired size and/or shape.

In some aspects, submount 52 can comprise any suitable mounting substrate, for example, a printed circuit board (PCB), a metal core printed circuit board (MCPCB), an external circuit, a dielectric laminate panel, a ceramic panel, an Al panel, AlN, $Al_2O_3$, or any other suitable substrate over which lighting devices such as LED chips may mount and/or attach. LED chips 22 disposed in emission area 54 can electrically and/or thermally communicate with electrical elements disposed with submount 52, for example, conductive traces (FIG. 4). Emission area 54 can comprise a plurality of LED chips 22 disposed within and/or below a filling material 58 such as illustrated in FIG. 4.

In some aspects, LED chips 22 can comprise any suitable size and/or shape of chip and can be vertically structured (e.g., electrical contacts on opposing sides) and/or horizontally structured (e.g., contacts on the same side or surface). LED chips 22 can comprise any style of chip for example, straight cut and/or bevel cut chips, a sapphire, SiC, or GaN growth substrate or no substrate. One or more LED chips 22 can form a multi-chip array of LED chips 22 electrically connected to each other and/or electrically conductive traces in combinations of series and parallel configurations. In one aspect, LED chips 22 can be arranged in one or more strings of LED chips, where each string can comprise more than one LED chip electrically connected in series. Strings of LED chips 22 can be electrically connected in parallel to other strings of LED chips 22. Strings of LED chips 22 can be arranged in one or more pattern (not shown). LED chips 22 can be electrically connected to other LED chips in series, parallel, and/or combinations of series and parallel arrangements depending upon the application.

Referring to FIG. 3, light emitter device 50 can further comprise at least one opening or hole, generally designated 60, that can be disposed through or at least partially through submount 52 for facilitating attachment of light emitter device 50 to an external substrate, circuit, or surface. For example, one or more screws (not shown) or pins can be inserted through the at least one hole 60 for securing device 50 to another member, structure, or substrate. Light emitter device 50 can also comprise one or more electrical attachment surfaces 62. In one aspect, attachment surfaces 62 comprise electrical contacts such as solder contacts or connectors. Attachment surfaces 62 can be any suitable configuration, size, shape and/or location and can comprise positive and negative electrode terminals, denoted by the "+" and/or "−" signs on respective sides of device 50, through which an electrical current or signal can pass when connected to an external power source.

One or more external electrically conductive wires (not shown) can be physically and electrically attached to attachment surfaces 62 via welding, soldering, clamping, crimpling, inserting, or using any other suitable gas-tight solder free attachment method known in the art. That is, in some aspects, attachment surfaces 62 can comprise devices configured to clamp, crimp, or otherwise attached to external wires (not shown). Electrical current or signal can pass into light emitter device 50 from the external wires electrically connected to device 10 at the attachment surfaces 62. Electrical current can flow into the emission area 54 to facilitate light output from the LED chips disposed therein. Attachment surfaces 62 can electrically communicate with LED chips 22 of emission area 54 via conductive traces 64 and 66 (FIG. 4). That is, in one aspect attachment surfaces 62 can comprise a same layer of material as first and second conductive traces 64 and 66 (FIG. 4) and therefore can electrically communicate to LED chips 22 attached to traces 64 and 66 via electrical connectors such as wire bonds 24.

Electrical connectors can comprise wire bonds 24 or other suitable members for electrically connecting LED chips 22 to first and second conductive traces 64 and 66 (FIG. 4).

As shown in FIG. 4, a filling material 58 can be disposed between inner walls of retention material 56. Filling material 58 can comprise an encapsulant that can include a predetermined, or selective, amount of one or more phosphors and/or lumiphors in an amount suitable for any desired light emission, for example, suitable for white light conversion or any given color temperature or color point. Alternatively, no phosphors may be included in filling material 58. Filling material 58 can comprise a silicone encapsulant material, such as a methyl and/or phenyl silicone material. Filling material 58 can interact with light emitted from the plurality of LED chips 22 such that a perceived white light, or any suitable and/or desirable wavelength of light, can be observed. Any suitable combination of encapsulant and/or phosphors can be used or provided, and combinations of differently colored phosphors and/or LED chips 22 can be used for producing any desired color points(s) of light. In some aspects, LED chips 22 can comprise one primarily red, green, blue, cyan, green, yellow, orange, amber, or white chip. In some aspects, filling material 58 can comprise one or more phosphors adapted to emit red, blue, yellow, or green light when activated by light from one or more LED chips 22.

In some aspects, retention material 56 can be adapted for dispensing, positioning, damming, or placing, about at least a portion of emission area 54. After placement of retention material 56, filling material 58 can be selectively filled to any suitable level within the space disposed between one or more inner walls of retention material 56 as indicated in broken lines. For example, filling material 58 can be filled to a level equal to the height of retention material 56 or to any level above or below retention material 56, for example, as indicated by the broken lines terminating at retention material 56 shown in FIG. 4. The level of filling material 58 can be planar or curved in any suitable manner, such as concave or convex (e.g., see broken lines in FIG. 4).

FIG. 4 illustrates retention material 56 dispensed or otherwise placed over submount 52 after wire bonding the one or more LED chips 22 such that retention material 56 is disposed over and at least partially covers at least a portion of the wire bonds 24. For example, wire bonds 24 of the outermost edge LED chips in a given set or string of LED chips 22 can be disposed within a portion of retention material 14. For illustration purposes, only four LED chips 22 are illustrated and are shown as electrically connected in series via wire bonds 24, however, device can contain many strings of LED chips 22 of any number, for example, less than four or more than four LED chips 22 can be electrically connected in series, parallel, and/or combinations of series and parallel arrangements.

In some aspects, strings of LED chips 22 can comprise diodes of the same and/or different colors, or wavelength bins, and different colors of phosphors can be used in the filling material 58 disposed over LED chips 22 that are the same or different colors in order to achieve emitted light of a desired color temperature or color point. In some aspects, LED chips 22 can attach directly to portions of conductive pad 70 and/or indirectly to portions of conductive pad 70 such as by connecting to one or more intervening layers (e.g., layers 68 and/or protective layer P, described below) which can be disposed between LED chip 22 and conductive pad 70 using any die attach technique or materials as known in art and mentioned above, for example epoxy or metal-to-metal die attach techniques and materials.

LED chips 22 can be arranged, disposed, or mounted over an electrically and/or thermally conductive pad 70. Conductive pad 70 can be electrically and/or thermally conductive and can comprise any suitable electrically and/or thermally conducting material. In one aspect, conductive pad 70 comprises a layer of Cu or a Cu substrate. LED chips 22 can be electrically connected to first and second conductive traces 64 and 66. One of first and second conductive traces 64 and 66 can comprise an anode and the other a cathode.

In some aspects, conductive traces 64 and 66 can also comprise a layer of electrically conductive Cu or Cu substrate. In some aspects, conductive pad 70 and traces 64 and 66 can comprise the same Cu substrate from which traces 64 and 66 have been singulated or separated from pad 70 via etching or other removal method. After etching, an electrically insulating solder mask 72 can be applied such that it is at least partially disposed between conductive pad 70 and respective conductive traces 64 and 66. Solder mask 72 can comprise a white material for reflecting light from light emitter device 50. One or more layers of material can be disposed between portions of LED chips 22 and conductive pad 70. Similarly, one or more layers of material can be disposed over conductive traces 64 and 66. For example and in one aspect, a first intervening layer or substrate of material 68 can be disposed between LED chips 22 and conductive pad 70 and disposed over traces 64 and 66. First layer of material 68 can comprise a layer of reflective Ag or Ag-alloy material for maximizing brightness of light emitted from light emitter device 50. That is, first layer of material 68 can comprise a Ag or Ag-containing substrate adapted to increase brightness of device 50. One or more optional, additional layers of material (not shown) can be disposed between first layer 68 and conductive pad 70 and/or first layer 68 and traces 64 and 66, for example, a layer of Ni can be disposed therebetween for providing a barrier between the Cu of pad and traces 70, 64, and 66 and the Ag of layer 68.

Notably, a protective layer P can be at least partially disposed over and/or adjacent to Ag components within device 50, for example, over first layer 68 of material which can coat conductive pad 70 and traces 64 and 68. Protective layer P can provide a barrier over the Ag coated components thereby preventing such components from being physically or electrically degraded via tarnishing, oxidizing, corroding, or other degrading phenomenon caused when harmful chemical, vaporous, or atmospheric complexes C permeate filling material 58. As described earlier, complexes C such as sulfur, sulfides, sulfates, chlorine complexes, bromine complexes, $NO_x$, oxygen, and/or moisture can damage Ag coatings or Ag coated components, such as layer 68 which can coat Cu components including pad 70 and/or traces 64 and 66. As described earlier, protective layer P can comprise an organic barrier coating adapted to prevent undesirable chemical or vapor complexes C from reaching vulnerable components within light emitter device 50 as shown by the broken lines and arrows.

In one aspect, protective layer P can as described previously comprise a barrier layer of poly(p-xylylene) polymers (e.g., such as Parylene) deposited in any suitable manner such as via CVD processing techniques and polymerized in-situ to form a protective polymer coating or protective layer P. Protective layer P is highly efficient in repelling harmful chemicals and vapors thereby protecting components comprising one or more of Ag or Ag containing portions within a device such as those disclosed herein from tarnishing, corroding, or otherwise degrading. Any other reactive organic barrier coating can be deposited directly on or over Ag or Ag-containing portions of components within the device. Such coatings can be applied via CVD processing and can polymerize in-situ, preferably at room temperature. In one aspect, poly(p-xylylene) polymer or Parylene or PARYLENE® layers may be preferred for thermal stability purposes; as such materials comprise a fluorocarbon-containing organic barrier coating. Other variations of fluorocarbon containing coatings can also comprise effective barrier coatings in accordance with the disclosure herein.

In some aspects, protective layer P can be an organic barrier coating comprising an aromatic polymer or copolymer. In some aspects, protective layer P can comprise an organic barrier coating resistant to chemical vapors and gases, such as sulfur. In some aspects, protective layer P can comprise arylene and/or aralkylene monomer groups (e.g., phenylene, napthylene, xylene, etc.). The arylene and/or aralkylene monomer groups can be unsubstituted or can be substituted by one or more aryl or alkyl group substituent (e.g., alkyl, aryl, halo, nitro, alkoxy, etc.). In some aspects, the aromatic polymer of protective layer P can be a copolymer of the arylene or aralkylene monomer group, further comprising one or more monomer units derived from a vinyl-containing monomer. In some aspects, the organic barrier coating is a fluorinated aromatic polymer or copolymer. In some embodiments, the organic barrier coating is a non-aromatic fluoropolymer.

In further embodiments, protective layer P can comprise a polyxylylene (e.g., poly(p-xylylene), a substituted poly(p-xylylene) or any other polymer prepared from a xylylene and/or comprising $-CH_2-(C_6H_4)-CH_2-$ repeating units wherein one or more of the hydrogen atoms in the repeating unit can be replaced by an alkyl or aryl group substituent). In some aspects, the polyxylylene can have between about 10 and about 100,000 repeating units (e.g., about 10, about 50, about 100, about 500, about 1,000, about 2,500, about 5,000, about 75,000, about 10,000, about 25,000, about 50,000, about 75,000, or about 100,000 repeating units), wherein each repeating unit has an aromatic group and can be substituted or unsubstituted. In some aspects, the organic barrier coating or protective layer P comprises poly(p-xylylene), poly(p-2-chloroxylylene), poly(p-2,6-dichloroxylylene) and fluoro-substituted poly(p-xylylene). In some aspects, the fluoro-substituted poly(p-xylylene) comprises fluoro substituents on non-aromatic carbon atoms and has the structure $[-CF_2-(C_6H_4)-CF_2-]_n$. In some aspects, the polyxylylene protective layer P is a homopolymer. In some aspects, the polyxylylene protective layer P is a copolymer of at least two different xylylene monomers.

FIG. 4 illustrates a sectional view of submount 52 over which LED chips 22 can be mounted or otherwise supported or arranged. Submount 52 can comprise, for example, conductive pad 70, first and second conductive traces 64 and 66, and solder mask 72 at least partially disposed between conductive pad 70 and each of conductive traces 64 and/or 66. Conductive traces 64, 66 and conductive pad 70 can be coated with a first layer 68, for example Ag. Protective layer P can be disposed over Ag as shown, or similar to any of the embodiments illustrated in FIGS. 5 to 12. Submount 52 can further comprise a dielectric layer 74, and a core layer 76. Solder mask 72 can directly adhere to portions of dielectric layer 74. For illustration purposes, submount 52 can comprise a MCPCB, for example, those available and manufactured by The Bergquist Company of Chanhassan, Minn. Any suitable submount 52 can be used, however. Core layer 76 can comprise a conductive metal layer, for example copper or aluminum. Dielectric layer 74 can comprise an electrically insulating but thermally conductive material to assist with heat dissipation through submount 52.

As noted earlier, device 50 can comprise a package which may not require or use any secondary optics to keep harmful elements from degrading conductive pad 70. Notably, devices, components and methods disclosed herein provide for improved chemical resistance and improved chemical properties where zero and/or a minimum loss of brightness occurs, even in the presence of harmful chemicals and can be applicable to any SMD type device or multi-array device disclosed herein. Such improvements can prevent Ag coated components from tarnishing, darkening, corroding, or otherwise degrading.

Of note, one or more additional processing techniques or steps can optionally be performed during manufacture of devices described herein for improving adhesion between one or more layers within the devices. Such optionally processing steps can be used and applied to devices previously shown and described, as well as those in FIGS. 5 through 12 described hereinbelow. For example, such optional techniques can be performed to one or more surfaces prior to deposition or application of one or more adjacent surfaces within a device. Techniques and/or optional processing steps can be performed on surfaces or layers, such as, for example and without limitation, Cu surfaces (e.g., inner portion 30 of elements 14, 16, and/or 18 of device 10 and/or surfaces of conductive pad 70, traces 64 and 66 of device 50), Ag surfaces (e.g., outer portion 32 of elements 14, 16, and/or 18 of device 10, layer of material 68 of device 50), and/or surfaces of protective layer P. In one aspect, one or more of these surfaces can be physically, chemically, or thermally prepared or treated to improve adhesion between the treated surface and adjacent surface(s) or adjacent layer(s).

Optional processing steps that are physical in nature can comprise, for example and without limitation, sandblasting, plasma etching, brushing, lapping, sanding, burnishing, grinding, and/or any suitable form of surface roughening (e.g., physically texturizing the surface) to improve adhesion between one or more layers or surfaces within devices shown and described herein. Optional processing steps that are chemical in nature can comprise, for example and without limitation, chemical etching, applying solvents, applying organic solvents, applying acids, applying bases, vapor degreasing, priming, or any suitable chemically process for treating a surface to improve adhesion between one or more layers or surfaces within devices shown and described herein. Optional thermal processing steps can comprise, without limitation, prebaking, preheating, or any suitable thermal treatment that improves adhesion between one or more layers or surfaces within devices shown and described herein.

FIGS. 5 to 12 are sectional views of previously described light emitter device 10 which illustrate various locations or placement of protective layer P within and/or over different surfaces of device 10. The location of protective layer P shown and described in FIGS. 5 to 12 can be equally applicable to device 50 (FIGS. 3 and 4) as well as any other LED device, component, or embodiment (e.g., downset devices, see FIG. 12, through-hole, TV backlighting downset components), however, for illustration purposes only device 10 has been illustrated in such numerous aspects.

In some aspects, at least one protective layer P can be used within the light emitter device for improving chemical resistance of the device by providing a barrier of protection against chemical complexes C (FIGS. 2, 4). In some aspects, protective layer P can prevent Ag components from tarnishing, corroding, darkening and/or degrading thereby retaining brightness and optical properties of light emitter device even in the presence of complexes C (FIGS. 2, 4).

FIGS. 5 to 12 illustrate a protective coating or layer P which can be applied directly and/or indirectly over the Ag coated thermal and electrical components 14 and 16, 18 at different locations with respect to device components and/or at different stages of production of device 10. In some aspects, the placement of protective layer P can be dictated by the order of processing steps. For example, if the LED chip 22 or wire bonds 24 are installed before protective layer P is applied, protective layer P will usually coat portions of the LED chips 22 and wire bonds as well as portions of Ag or Ag-containing surface(s). Other processing steps may involve the masking and/or subsequent removal of protective layer P. All processing sequences and therefore placements of protective layer P are contemplated and are not limited to such exemplary sequences and/or locations as described herein.

Figure 8:
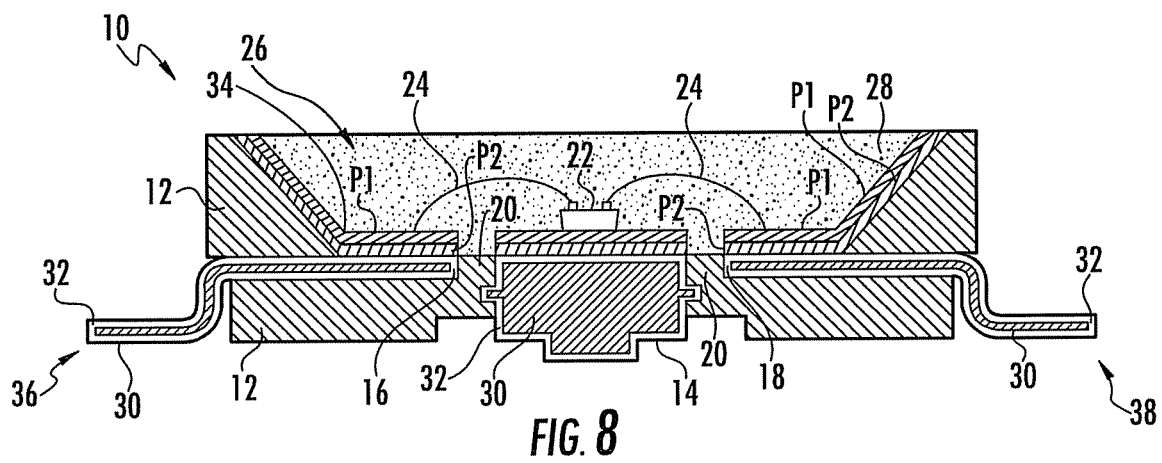

Two or more protective layers, for example, a first and a second organic barrier protective layer, P1 and P2 (e.g., FIG. 8) respectively, can be used within device 10 for protecting against harmful chemical complexes which may permeate device 10 and degrade components of device 10 (see FIG. 8). Initially of note, and for illustration purposes only, the number of protective layers shown herein may be limited to two, however, any suitable number of protective layers comprising organic barrier coatings applied via CVD processing can be used applied at any step in the production process and/or at any location within device 10, and such application steps and/or locations are contemplated herein.

As described earlier, protective layer P (and/or P1 and P2, FIG. 8) can comprise an organic barrier coating of polyxylylene and/or a fluorocarbon containing polyxylylene having a thickness comprising, for example, between approximately 1 nm and 100 µm. Any sub-range of thickness between approximately 1 nm and 100 µm is contemplated as described previously. Protective layer P can be delivered and/or applied in any form to device 10, such as but not limited to application via CVD. Protection layer P can provide protection against undesired chemicals, chemical vapors, and chemical complexes C (FIGS. 2, 4) serving as a flexible anti-oxidation and/or anti-corrosion layer over Ag and Cu, and substrates containing such metals.

Figure 5:
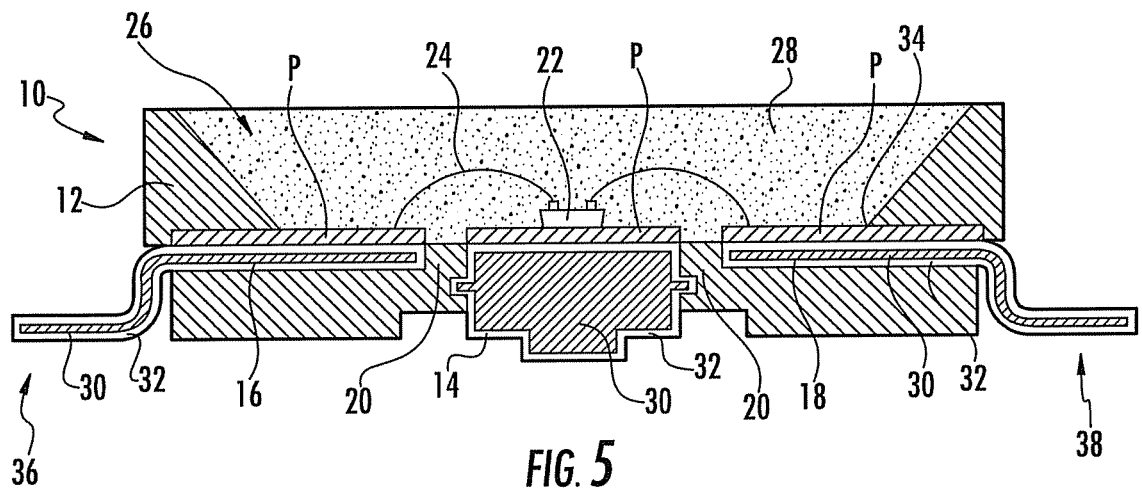
FIGS. 5 through 12 are cross-sectional views of light emitter devices according to the disclosure herein.

As FIG. 5 illustrates, protective layer P can be applied, deposited, or otherwise disposed over electrical and thermal elements 16, 18, and 14 before the processing step of molding the device body 12 about the leadframe components. That is, in some aspects, protective layer P can extend to a location at least partially within a portion of the molded plastic body 12 such that it contacts one or more surfaces of body 12. In one aspect, protective layer P can be disposed between one or more portions of body 12 as illustrated. Protective layer P can also be disposed between LED chip 22 and outer portion 32 of thermal element 14. As previously described, outer portion 32 can comprise a layer of Ag (or Ag-alloy coating or plating) over which protective layer P can provide a protective barrier for protecting against complexes which can tarnish, oxidize, or corrode the Ag. Protective layer P can retain optical properties (e.g., brightness) of device 10 despite exposure to undesired chemical complexes which may permeate the device. Protective layer P may also optionally be applied such that it fully extends over floor 34 of cavity 26 and within portions of body 12 such that layer P extends over isolating portions 20 of body as well as over portions of Ag coated components (e.g., over outer portions 32 of elements 14, 16, and 18).

Figure 6:
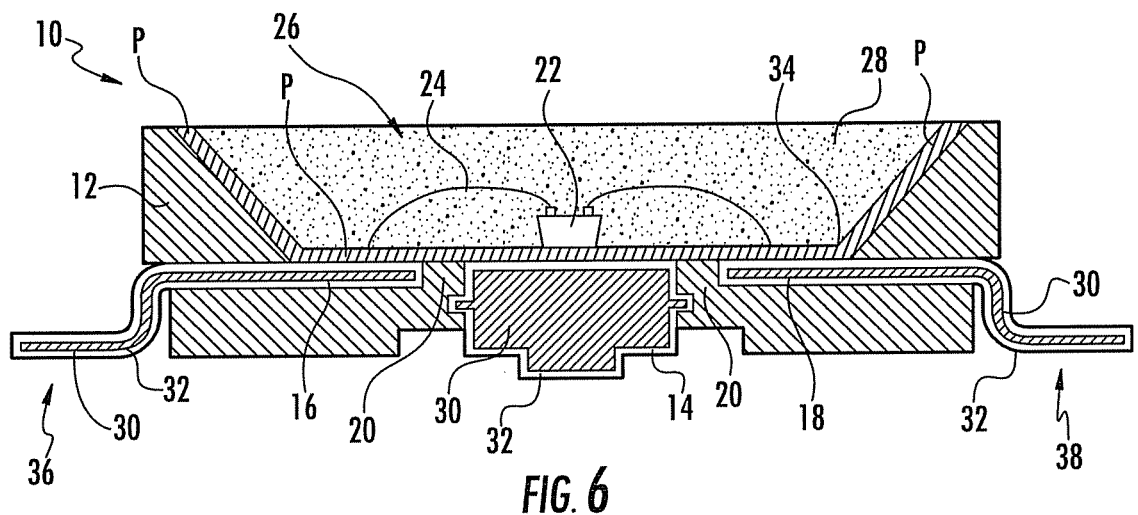

FIG. 6 illustrates an embodiment of device 10 where protective layer P can be applied or deposited after the processing step of molding the body 12, but prior to die attaching one or more LED chips, wire bonding the LED chips, and/or application of encapsulant 28. Thus, protective layer P can extend to a location within device 10 that is below LED chip 22 and along at least a portion of cavity floor 34. In some aspects, protective layer P can extend between upper surfaces of thermal element 14 and LED chip 22. In some aspects, protective layer P can be disposed over the entire surface of cavity floor 34, thus, disposed over surfaces of each of thermal and electrical elements 14, 16, and 18 and isolating portions 20 of body 12. In some aspects, protective layer P can optionally extend along one or more side walls of reflector cavity 26 as shown. Where desired, additional processing steps such as masking and/or etching protective layer P can be employed and are contemplated herein.

Figure 7:
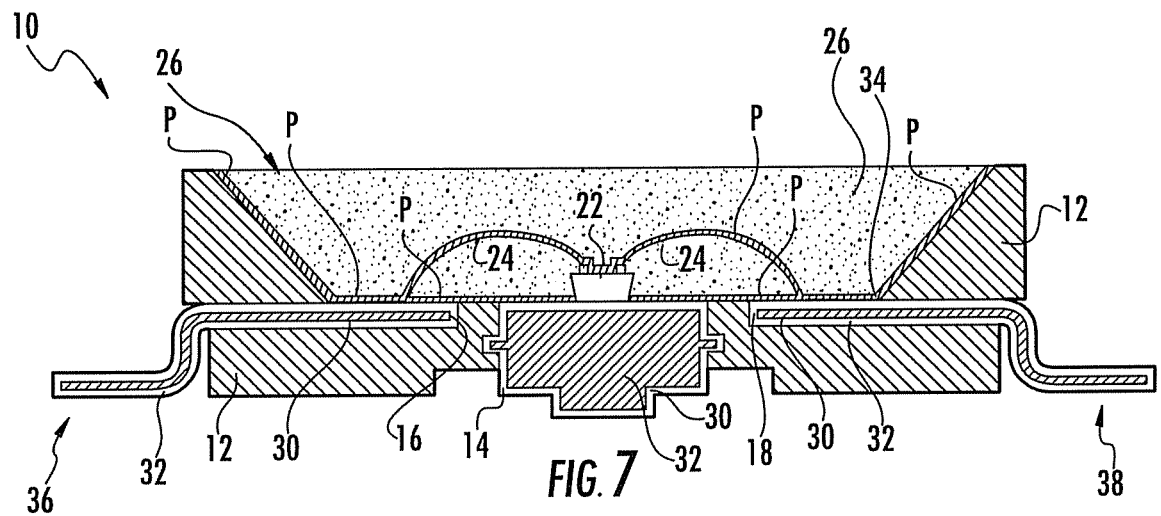

FIG. 7 illustrates an embodiment of device 10 where protective layer P can be applied after the processing step of wire bonding but before the processing step of application of encapsulant 28. In one aspect, protective layer P can at least partially coat portions or surfaces of wire bonds 24, LED chip 22, walls of cavity 26, cavity floor 34, and surfaces of thermal element 14 and electrical elements 16 and 18 (e.g., outer portions 32 of elements 14, 16, and 18).

FIG. 8 illustrates an embodiment where more than one protective layer can be applied, for example, a first protective layer P1 and a second protective layer P2. First and second protective layers P1 and P2 can be applied at any processing step during production of light emitter device 10 (and/or device 50), thereby assuming the placement illustrated and described in any of FIGS. 2, 4, and 5 to 12 (e.g., the only difference being application of more than one protective layer P). Each of first and second protective layers P1 and P2 can comprise an organic barrier material as previously described. Protective layers P1 and P2 can comprise any thickness ranging from approximately 1 nm to approximately 100 μm. Thicknesses less than 1 nm and/or greater than 100 μm can also be used, however, where more than one layer is present. First and second protective layers P1 and P2 can be applied as shown over outer portions 32 of thermal and electrical elements 14, 16, and 18 before die attaching LED chip 22. First and second layers P1 and P2 can optionally extend up side walls of reflector cavity 26 as shown.

Figure 9:
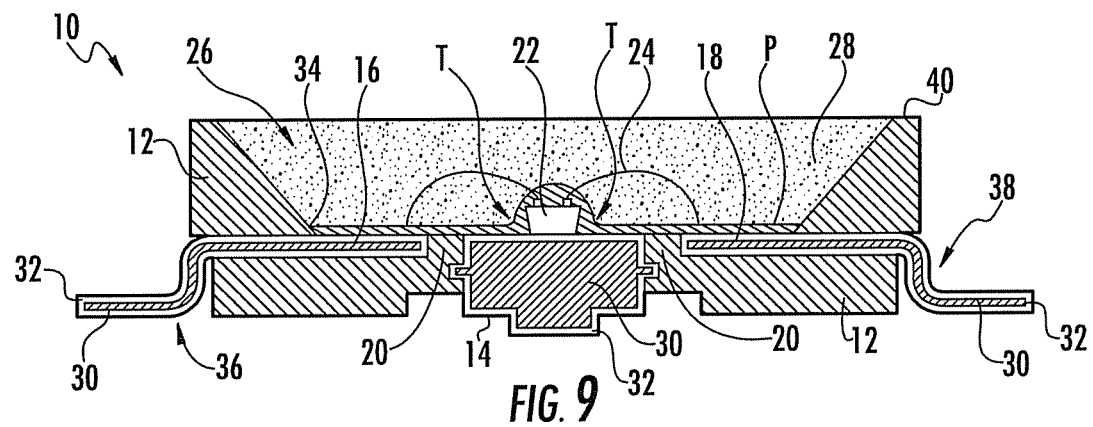

FIG. 9 illustrates a further embodiment of device 10, where protective layer P has been applied after the processing step of die attach but before the step of applying encapsulant 28. That is, protective layer P can be located such that it extends about the side and upper surfaces of LED chip 22, and over portions of wire bonds 24, where wire bonds 24 attach to LED chip 22 (e.g., at wire bond balls). Protective layer P can also be disposed entirely over floor 34 of cavity over outer portions 32 of elements 14, 16, and 18 as well as isolating portions 20 of body 12. Protective layer P can optionally extend up side walls of cavity 26. Notably, protective layer P can, but does not need to comprise a uniform thickness. For example, layer P may develop thicker areas or fillets around features within light emitter device 10 during the in-situ polymerization of layer P. For example, layer P may be thicker in areas T surrounding LED chip 22 as indicated. Thinner areas of protective layer P are also contemplated and can be provided herein.

Figure 10:
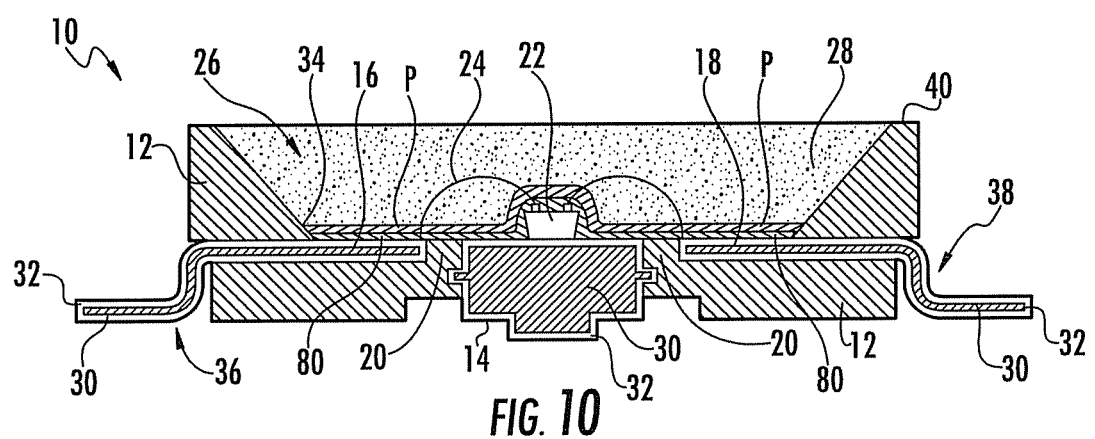

FIG. 10 illustrates an embodiment of device 10 where protective layer P has been applied after die attachment of LED chip 22 but prior to application of encapsulant 28. As FIG. 10 illustrates, protective layer P can be located and applied subsequently over a first layer 80. First layer 80 can comprise any type of coating or layer, for example, an adhesion coating or layer, a light-affecting coating or layer, an optical coating, or another protective barrier coating or layer such as an organic coating, inorganic coating, or oxide.

In some aspects, first layer 80 comprises a layer of light-affecting material such as a layer of encapsulant containing phosphor material that emits light of a desired color point when activated by light emission from the LED chip 22. First layer 80 can be disposed between portions of LED chip 22 and protective layer P, between outer portions 32 of elements 14, 16, and 18 and protective layer P, and/or between isolating portions 20 of body 12 and protective layer P. In an alternative embodiment, LED chip 22 can comprise a horizontally structured (i.e., both contacts on the same side, a bottom side) chip that is directly attached (e.g., no wire bonds) to electrical elements 16 and 18. That is, electrical contacts or bond pads (not shown) can be disposed on a bottom surface of LED chip 22 and directly attach to electrical elements 16 and 18 via electrically conductive die attach adhesive (e.g., silicone, epoxy, or conductive silver (Ag) epoxy such that the electrical contacts of LED chip 22 electrically communicate directly to elements 16 and 18 without the need for wire bonds 24. First layer 80 can then be applied over LED chip 22 and can comprise a layer of encapsulant containing phosphor. Protective layer P can then be applied over each of LED chip 22 and first layer 80 as indicated.

Figure 11:
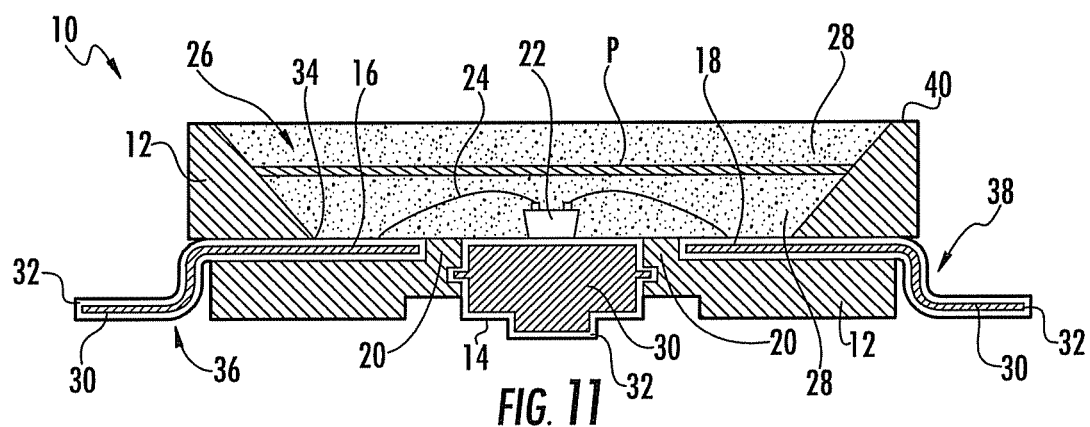

FIG. 11 illustrates a further embodiments of device 10, where protective layer P can be applied during the processing step of application (e.g., dispensing) of encapsulant 28. For example, FIG. 11 illustrates protective layer P applied during the processing step of application of encapsulant 28 such that it is disposed between more than one discreet portion of encapsulant 28. In this embodiment, protective layer P can be disposed between two portions of encapsulant 28, such that undesirable complexes C (FIG. 2) can be prevented from reaching Ag coated components (e.g., outer portion 32 of elements 14, 16, and 18) thereby preventing any potential damage, corrosion, or darkening that may occur to the Ag components. That is, protective layer P can be disposed between layers or portions of encapsulant 28 or between two or more separate encapsulation steps. In some aspects, more than one protective layer P can be provided between two or more layers of encapsulant 28. This can advantageously allow device 10 to incur approximately zero, or minimal, brightness loss during operation, even in the presence of harmful chemicals, chemical vapors, oxygen, or moisture.

Figure 12:
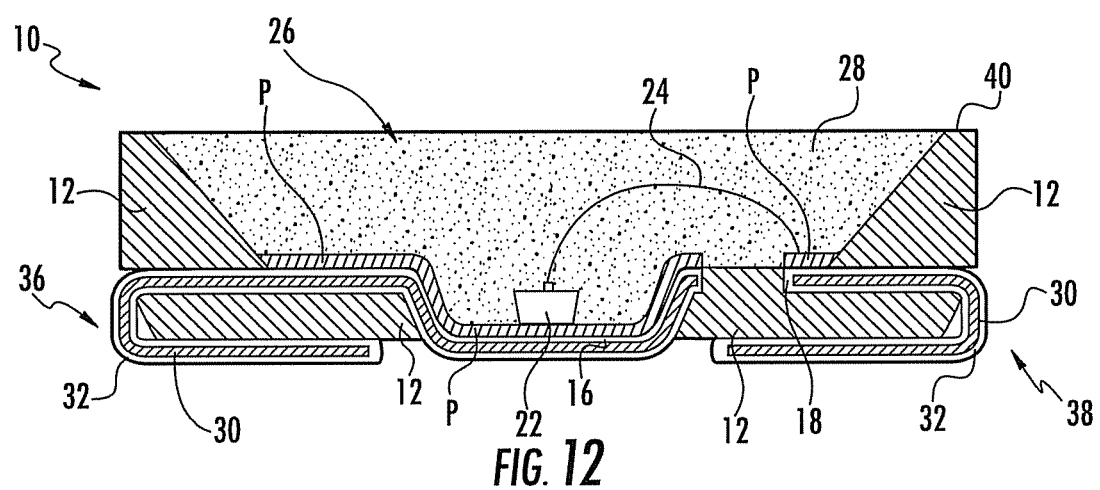

FIG. 12 illustrates a further embodiment of device 10. Device 10 can comprise two electrical elements 16 and 18 to which LED chip 22 can electrically connect. Tab portions 36 and 38 can bend inwardly towards each other thereby adapting either a J-bend. In this embodiment, LED chip 22 can comprise a vertically structured device with a first electrical contact or bond pad on a bottom surface and a second electrical contact or bond pad on the opposing top surface. The first electrical contact can electrically and physically connect with first electrical element 16 via a die attach adhesive (e.g., silicone, flux, solder, epoxy, etc.) and second electrical contact can electrically and physically connect to second electrical element 18 via wire bond 24. In this embodiment, light emitter device 10 can comprise a downset or recessed type of package where LED chip 22 and/or at least a first electrical element can be on a different plane than other components of the LED package or device (e.g., on a different plane from second electrical element 18). In this embodiment, protective layer P can be applied in any of the locations shown in FIGS. 5-12. For illustrations purposes, protective layer P is shown as applied before attaching and wire bonding LED chip 22. However, any suitable sequence for placing and/or location of protective layer P is contemplated, for example, along one or more sidewalls of device 10 and/or applied in combination with other layers. Protective layer P can be applied such that it is disposed over a portion of body 12 (e.g., between 16 and 18) and can be subsequently removed as shown via optional masking and/or etching steps if desired. Protective layer P can be applied in one or more substantially uniform or substantially non-uniform layers.

Embodiments of the present disclosure shown in the drawings and described above are exemplary of numerous embodiments that can be made within the scope of the appended claims. It is contemplated that the configurations of light emitter devices improved for chemical resistance and methods of making the same can comprise numerous configurations other than those specifically disclosed, including combinations of those specifically disclosed.

What is claimed is:

1. A component of a light emitter device, the component comprising:
   a silver (Ag) portion at least partially disposed over a surface of the component;
   one or more light emitter chips disposed over the Ag portion, wherein the Ag portion is configured to reflect light from the one or more light emitter chips; and
   two or more protective layers disposed over the Ag portion, each of the two or more protective layers comprising an organic barrier material configured to block chemical complexes from contacting the Ag portion to increase chemical resistance of the Ag portion, wherein the two or more protective layers are disposed between a first layer of encapsulant and a second layer of encapsulant, and wherein the two or more protective layers are in contact with the first and second layers of encapsulant,
   wherein the two or more protective layers comprise a polyxylylene, poly(p-xylylene), a substituted poly(p-xylylene), a fluorocarbon containing poly(p-xylylene), a polymer prepared from a xylylene, or a polymer comprising —CH$_2$—(C$_6$H$_4$)—CH$_2$— based repeating units.

2. The component of claim 1, wherein the two or more protective layers comprise a polymer with repeating units comprising an alkyl or aryl group substituent.

3. The component of claim 1, wherein the two or more protective layers comprise a polymer with repeating units comprising a halogen substituent.

4. The component of claim 1, wherein the two or more protective layers comprise a polymer, and wherein some or substantially all of a plurality of aromatic rings derived from a xylylenic polymer precursor species have been converted to cyclic or non-cyclic non-aromatic groups.

5. The component of claim 1, wherein the two or more protective layers comprise poly(p-xylylene), poly(p-2-chloroxylylene), poly(p-2,6-dichloroxylylene) and fluoro-substituted poly(p-xylylene).

6. The component of claim 1, wherein the two or more protective layers comprise a layer of Parylene or a variation of such polymer family.

7. The component of claim 1, wherein the two or more protective layers comprise a thickness between approximately 1 nm to approximately 100 μm.

8. The component of claim 7, wherein the two or more protective layers comprise a thickness between approximately 0.5 μm to approximately 1 μm.

9. The component of claim 1, wherein the Ag portion comprises a Ag-containing substrate.

10. The component of claim 9, wherein the one or more light emitter chips comprises one or more light emitting diode (LED) chips, and wherein the one or more LED chips is at least partially disposed between the two or more protective layers and the Ag-containing substrate.

11. The component of claim 9, wherein the first layer of encapsulant is at least partially disposed between the two or more protective layers and the Ag-containing substrate.

12. The component of claim 1, wherein at least one of the first and second layers of encapsulant comprises phosphor.

13. The component of claim 9, wherein a layer of material is disposed between the two or more protective layers and the Ag-containing substrate.

14. The component of claim 1, wherein the two or more protective layers are of a uniform or non-uniform thickness.

15. The component of claim 9, wherein the component is incorporated within a surface mount device (SMD) type light emitter device.

16. The component of claim 1, wherein the two or more protective layers are configured to prevent the Ag portion from tarnishing, corroding, darkening and/or degrading from exposure to chemical complexes.

* * * * *